US009973189B2

(12) United States Patent
Wyland et al.

(10) Patent No.: US 9,973,189 B2
(45) Date of Patent: *May 15, 2018

(54) INSULATED GATE DEVICE DISCHARGING

(71) Applicant: MICROSOFT TECHNOLOGY LICENSING, LLC, Redmond, WA (US)

(72) Inventors: David C. Wyland, Morgan Hill, CA (US); Jonathan Alan Dutra, Saratoga, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/677,513

(22) Filed: Aug. 15, 2017

(65) Prior Publication Data
US 2017/0366181 A1  Dec. 21, 2017

Related U.S. Application Data

(63) Continuation of application No. 14/747,886, filed on Jun. 23, 2015, now Pat. No. 9,755,636.

(51) Int. Cl.
*H03K 17/687* (2006.01)
*H03K 17/567* (2006.01)
(Continued)

(52) U.S. Cl.
CPC ......... *H03K 17/567* (2013.01); *H03K 5/1534* (2013.01); *H03K 17/04123* (2013.01); *H03K 17/6877* (2013.01)

(58) Field of Classification Search
CPC .................................................. H03K 17/567
(Continued)

(56) References Cited

U.S. PATENT DOCUMENTS 3,896,367 A   7/1975 Frantz
4,590,395 A   5/1986 O'Connor et al.
(Continued)

FOREIGN PATENT DOCUMENTS

WO        0050338 A1    8/2000

OTHER PUBLICATIONS

International Search Report and Written Opinion Issued in PCT Appln No. PCT/US2016/037307, dated Aug. 25, 2016, 11 pages.
(Continued)

*Primary Examiner* — Lincoln Donovan
*Assistant Examiner* — Metasebia Retebo
(74) *Attorney, Agent, or Firm* — Jacob P. Rohwer; Newport IP, LLC

(57) ABSTRACT

A large-power insulated gate switching device (e.g., MOSFET) is used for driving relatively large surges of pulsed power through a load. The switching device has a relatively large gate capacitance which is difficult to quickly discharge. A gate charging and discharging circuit is provided having a bipolar junction transistor (BJT) configured to apply a charging voltage to charge the gate of the switching device where the BJT is configured to also discontinue the application of the charging voltage. An inductive circuit having an inductor is also provided. The inductive circuit is coupled to the gate of the switching device and further coupled to receive the charging voltage such that application of the charging voltage to the inductive circuit is with a polarity that induces a first current to flow through the inductor in a direction corresponding to charge moving away from the gate and such that discontinuation of the application of the charging voltage to the inductive circuit induces a second current flowing through the inductor in the direction corresponding to charge moving away from the gate such that the second current discharges the gate of the switching device.

(Continued)

Faster turn off of the switching device is thus made possible and is synchronized to the discontinuation of the charging voltage.

20 Claims, 9 Drawing Sheets

(51) Int. Cl.
*H03K 5/1534* (2006.01)
*H03K 17/0412* (2006.01)

(58) Field of Classification Search
USPC .......................................................... 327/434
See application file for complete search history.

(56) References Cited

U.S. PATENT DOCUMENTS

| | | | |
|---|---|---|---|
| 4,885,486 | A | 12/1989 | Shekhawat et al. |
| 5,264,736 | A | 11/1993 | Jacobson |
| 5,420,532 | A | 5/1995 | Teggatz et al. |
| 6,992,520 | B1 | 1/2006 | Herbert |
| 7,285,876 | B1 | 10/2007 | Jacobson |
| 7,449,947 | B2 | 11/2008 | Unnikrishnan et al. |
| 7,961,484 | B2 | 6/2011 | Lalithambika et al. |
| 7,994,827 | B2 | 8/2011 | Williams |
| 8,188,682 | B2 | 5/2012 | Nalbant |
| 8,456,201 | B2 | 6/2013 | Olivo |
| 2007/0109025 | A1 | 5/2007 | Liu |
| 2011/0273220 | A1 | 11/2011 | Lin et al. |
| 2012/0068683 | A1 | 3/2012 | Liu et al. |

OTHER PUBLICATIONS

Huang, et al., "Low Jitter and Drift High Voltage IGBT Gate Driver," In Proceedings of 14th IEEE International Pulsed Power Conference, Digest of Technical Papers, Jun. 15, 2003, 4 pages.
"How to reduce MOSFET turn-off delay," Published on Aug. 2, 2013 available at: http://electronics.stackexchange.com/questions/74465/how-to-reduce-mosfet-turn-off-delay.
Non-Final Rejection dated Jul. 19, 2016 in U.S. Appl. No. 14/747,886.
Response dated Aug. 22, 2016 in U.S. Appl. No. 14/747,886.
Final Rejection dated Dec. 15, 2016 in U.S. Appl. No. 14/747,886.
Response dated Jan. 30, 2017 in U.S. Appl. No. 14/747,886.
Non-Final Rejection dated Mar. 2, 2017 in U.S. Appl. No. 14/747,886.
Response dated Apr. 13, 2017 in U.S. Appl. No. 14/747,886.
Notice of Allowance and Fees Due dated May 11, 2017 in U.S. Appl. No. 14/747,886.

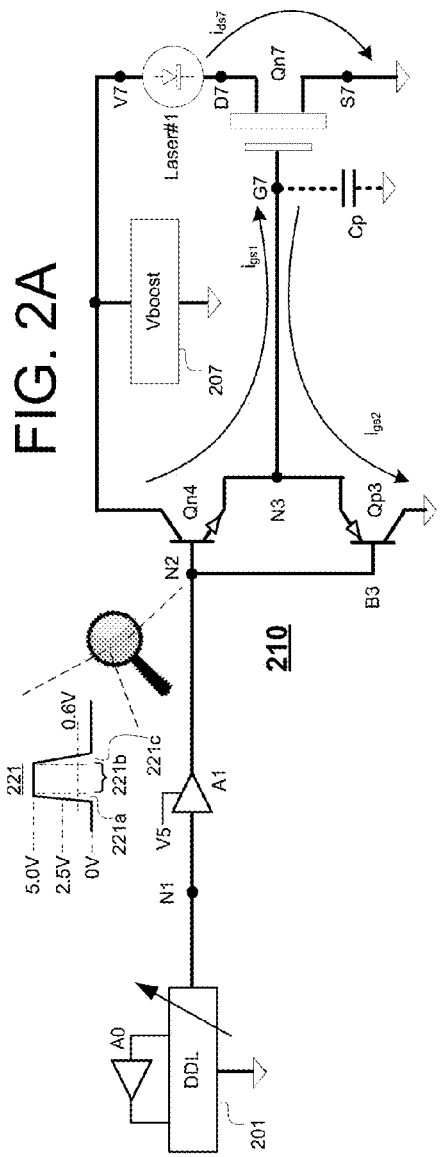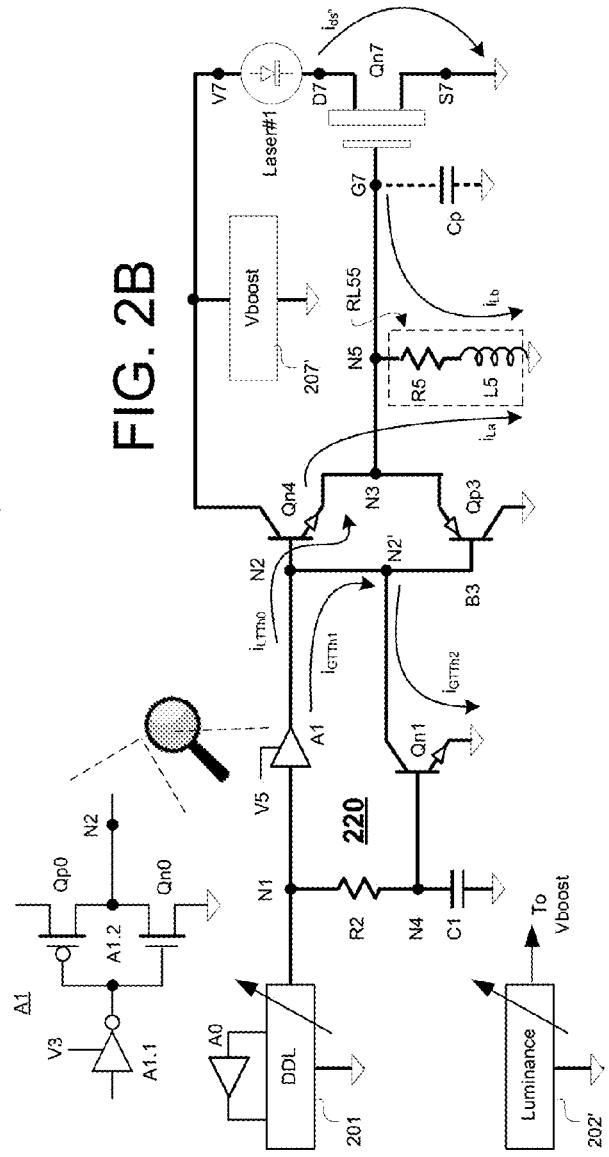

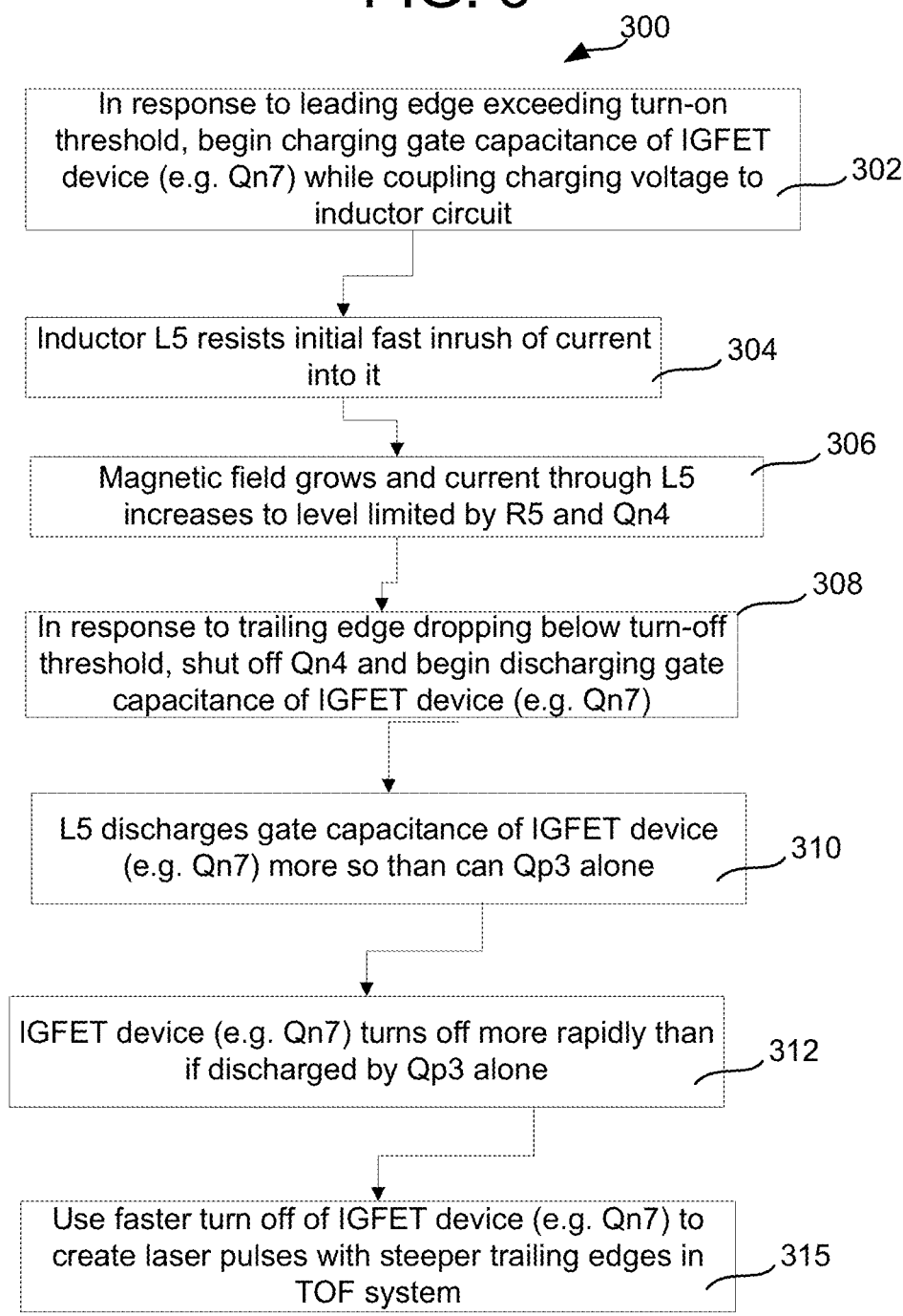

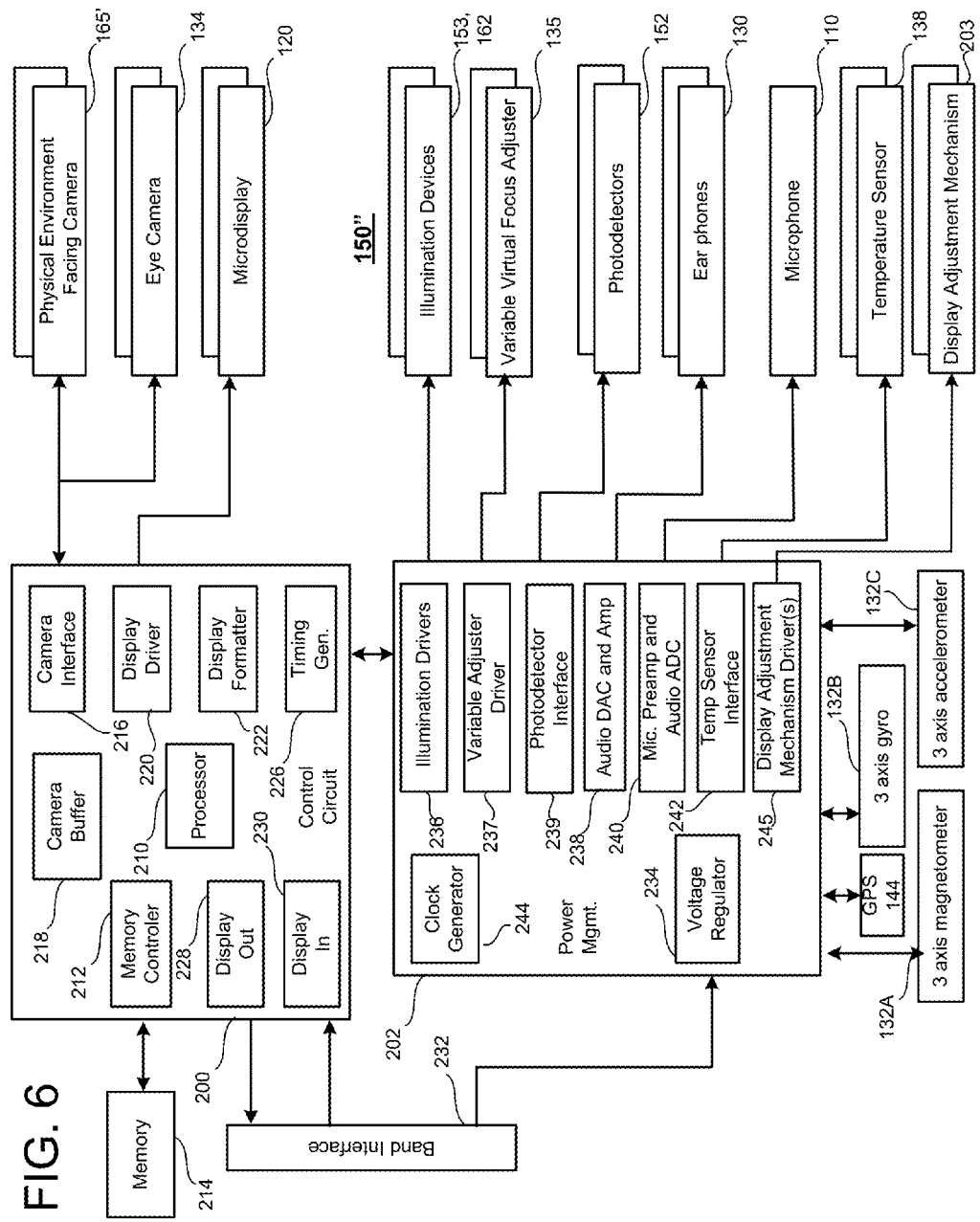

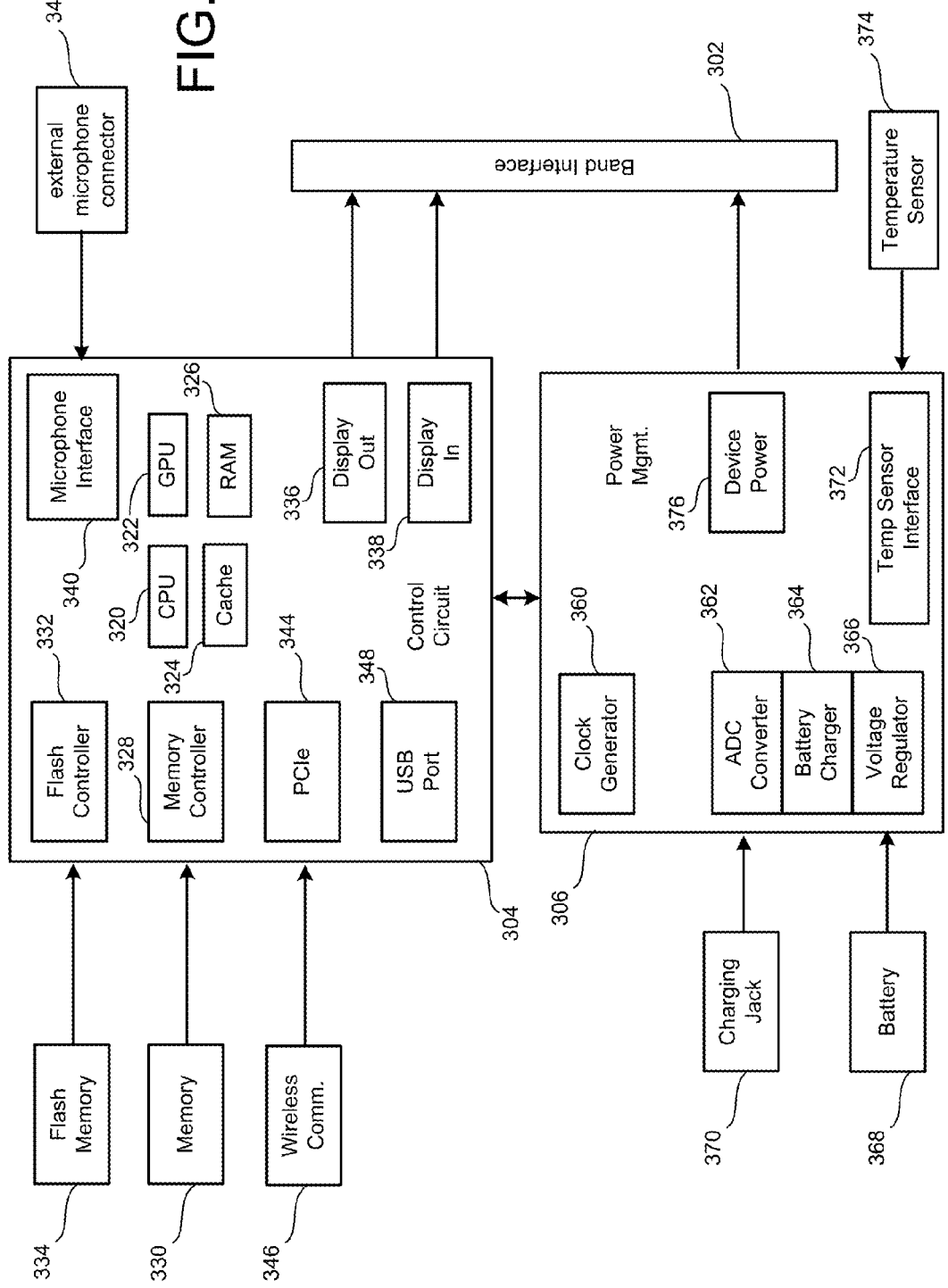

US 9,973,189 B2

INSULATED GATE DEVICE DISCHARGING

This application is a continuation of and claims benefit of U.S. patent application Ser. No. 14/747,886, filed Jun. 23, 2015 and originally entitled "INSULATED GATE DEVICE DISCHARGING" where the disclosure of said application is incorporated herein by reference in its entirety.

BACKGROUND

Insulated gate switching devices such as MOSFET's (Metal-Oxide-Semiconductor Field Effect Transistors) are increasingly finding application in high frequency, high timing resolution systems. One example is a Time of Photonic Flight determining sub-system (also referred to here as a TOF sub-system or LIDAR sub-system). Such may be used for example in three-dimensional (3D) augmented reality systems.

SUMMARY

In accordance with one aspect of the present disclosure, a method is provided of charging and discharging a gate of an insulated gate switching device (e.g., IGFET) where the method comprises: applying a charging voltage to charge the gate of the switching device; at substantially a same time applying the charging voltage to an inductive circuit having an inductance, the inductive circuit being coupled to the gate, the applying of the charging voltage to the inductive circuit being with a polarity that induces a first current to flow through the inductance in a direction corresponding to charge moving away from the gate; and discontinuing the applying of the charging voltage to the inductive circuit; wherein the discontinuing of the applying of the charging voltage to the inductive circuit induces a second current to flow through the inductance in the direction corresponding to charge moving away from the gate, the second current discharging the gate of the switching device.

In accordance with another aspect of the present disclosure, a circuit for charging and discharging a gate of an insulated gate switching device such as an insulated gate field effect transistor (IGFET) is provided, where the circuit comprises: a first transistor configured to apply a charging voltage to charge the gate of the IGFET, the first transistor being configured to also discontinue the application of the charging voltage; and an inductive circuit having an inductance, the inductive circuit being coupled to the gate of the IGFET, the inductive circuit being further coupled and configured to receive the charging voltage such that application of the charging voltage to the inductive circuit is with a polarity that induces a first current to flow through the inductance in a direction corresponding to charge moving away from the gate and such that discontinuation of the application of the charging voltage to the inductive circuit induces a second current flowing through the inductance in the direction corresponding to charge moving away from the gate such that the second current discharges the gate of the IGFET.

BRIEF DESCRIPTION OF THE DRAWINGS

FIG. 2A is a schematic diagram of a first gate charging and discharging circuit in which discharge time may be unduly lengthened.

FIG. 2B is a schematic diagram of a second gate charging and discharging circuit having just a few added components and in which discharge time may be advantageously reduced.

FIG. 3 is a flowchart explaining a process by way of which relatively short charging and discharging times may be realized.

FIG. 6 is a block diagram of one embodiment of hardware and software components of a see-through, near-eye display system as may be used with one or more embodiments.

FIG. 7 is a block diagram of one embodiment of the hardware and software components of a processing unit associated with a see-through, near-eye, mixed reality display unit.

DETAILED DESCRIPTION

Figure 1A:
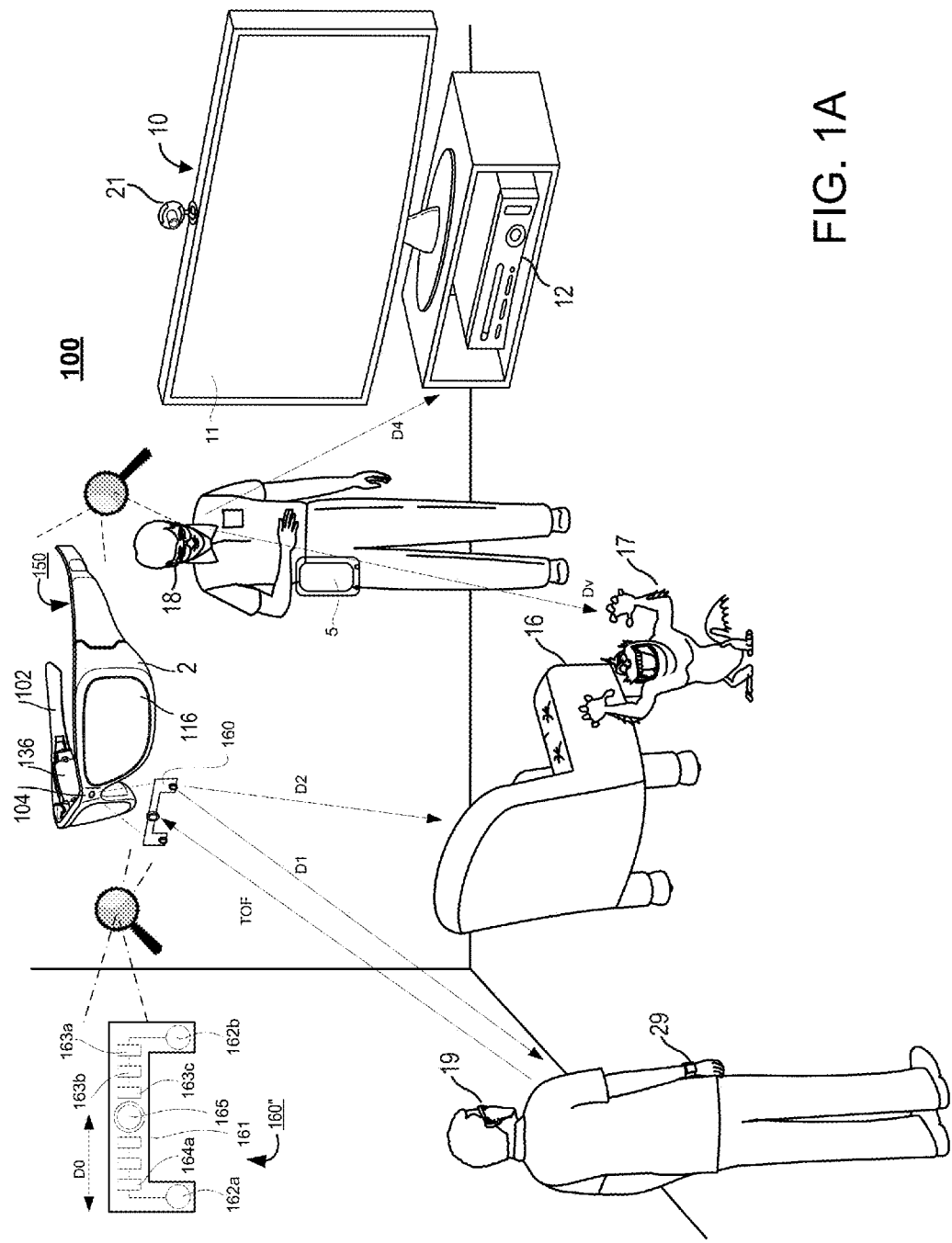
FIG. 1A depicts a see-through HMD embodiment having a TOF sub-system embedded therein for enabling distance determination for real objects in a field of view seen by a user wearing the see-through HMD.

In one embodiment of a Time of Photonic Flight (TOF) determination system in accordance with the present disclosure, a photonic energy waveform corresponding to certain repetition frequencies and phases is produced as a series of time-bound bundles of photons with each bundle being output for example in the form of a short duration yet high energy rectangular pulse of light preferably having steep rising and falling edges in addition to its narrow pulse width. More specifically, the per pulse, peak plateau width may desirably be on the order of about 50 nanoseconds (ns) or less as an example while the leading and trailing pulse edges of the pulse each desirably occupy no more than about 10 ns. The time it takes for the output pulses of photons to leave their emitter, travel through air to a reflective target and return to an appropriately sensitized sensor is referred to as the Time of Flight (TOF). Distance between the emitter/sensor pair and the target can be calculated as being TOF*C'/2 where C' is the speed of light in the transmission medium (e.g., air). Measurement resolution can be improved by modulating the phases of the pulse trains and by relying on the timings of the leading and trailing pulse edges. Precision and signal to noise ratio can be improved through use of multiple samples, correlation, and by causing the leading and trailing pulse edges to be as steep as can be practically achieved. Producing steep and precisely timed leading and trailing edges for high energy pulses by use of insulated gate switching devices is difficult however due to relatively large parasitic capacitances typically associated with high power insulated gate switching devices.

More specifically, a power MOSFET or other such insulated gate field effect device (e.g., IGFET) may be used for selectively driving relatively large surges of pulsed power (e.g., 0.5 Amperes per pulse or greater) through a laser emitter of a Time of Flight (TOF) determining system. Due to the magnitude of the current surges and a desire for minimized drain to source resistance, the power MOSFET has a relatively large effective channel width and thus a corresponding large gate capacitance where the latter capacitance is difficult to quickly discharge. A gate charging and discharging circuit is provided having a first bipolar junction transistor (BJT) configured to apply a charging voltage to charge the gate of the MOSFET in response to receipt of a leading edge of a supplied input pulse. The first BJT is configured to also discontinue the application of the charging voltage in response to receipt of a trailing edge of the input pulse and to supply a trickle current during a duration between the leading and trailing edges. An inductive circuit having an inductor is also provided. The inductive circuit is coupled to the MOSFET gate and further coupled to receive the charging voltage such that application of the charging voltage to the inductive circuit has a polarity that induces a first current to flow through the inductor in a direction corresponding to charge moving away from the gate of the MOSFET and such that discontinuation of the application of the charging voltage to the inductive circuit induces a second current flowing through the inductor in the direction corresponding to charge moving away from the gate such that the second current discharges the gate of the MOSFET gate. Faster turn off of the MOSFET and steeper falling edges of the laser light pulses are thus made possible.

In one embodiment, the power MOSFET, the gate charging and discharging circuit and the laser emitter are mounted on a printed circuit board (PCB) that attaches to a head mounted, mixed reality display. The combination of the power MOSFET, the gate charging and discharging circuit and the laser emitter is repeated a number of times on the PCB without unduly adding to the weight, size, cost or complexity of the head mounted, mixed reality display.

In terms of a broader system view, insulated gate field effect devices such as IGFET's (Insulated Gate Field Effect Transistors) and MOSFET's (Metal-Oxide-Semiconductor Field Effect Transistors) are increasingly finding application in high frequency, high timing resolution systems, for example in Time of Photonic Flight determining sub-systems (also referred to as a TOF sub-systems) as used for example in three-dimensional (3D) augmented reality systems. Specific examples of systems in which a TOF sub-system may be embedded include mixed-reality Head Mounted Display (HMD) systems in which the TOF emitter/sensor pair is mounted on a stand alone HMD and used for measuring distance between the user's head and HMD pointed-to real objects in the user's immediate surroundings. These measured distances are then used by appropriate data processing means (e.g., on-board and/or external electronic signal processing means) to construct in real-time a three-dimensional (3D) mapping of real objects surrounding the user. The mapped real objects are modeled as existing in an XYZ reference frame where Z is depth distance between the user and an in-field-of-view XY plane orthogonal to the Z direction. The frame may be filled with real objects and one or more superimposed virtual objects. An illusion of 3D stereoscopic vision may be created by using a differentiated pair of see-through binoculars where there is a separate, electronically-driven and superimposable optical display sub-system for each of a user's two eyes when viewing an augmented reality scene. The term Augmented Reality (AR) is used to refer to displaying an augmented real-world environment where the perception of the real-world environment (or image data representing the real-world environment) is augmented or modified with addition of computer-generated virtual image data. An AR environment may be used to enhance numerous applications including single or multi-user real-time video gaming, real-time mapping, navigation, and various real-time mobile device applications.

When a TOF sub-system is to be used for providing high resolution distance measurement (e.g., on the order of millimeters) over a wide range of distances it is desirable to have: (1) high powered pulses of photonic energy of an appropriate wavelength (e.g., outside the visible spectrum); (2) very steep leading and trailing pulse edges (e.g., less than 10 ns each); and (3) precise synchronization between the electronic drive signals of the optical energy emitter (e.g., an IR laser diode) and the optical return sensor (e.g., an IR sensing, gate-able CCD array of pixels). Unfortunately, when use is made of a high power MOSFET such as one that episodically conducts large surges of current (e.g., 0.5 A or greater magnitudes of peak current per pulse) for driving the optical energy emitter (e.g., one or more IR laser diodes) to supply high powered pulses of photonic energy, the power MOSFET tends to exhibit a relatively large gate-to source capacitance. Rapid turn off of the power MOSFET then becomes problematic. Various approaches can be attempted such as use of dual polarity power supplies. However, the need for precise timing of the leading and trailing pulse edges and the need for precise synchronization between the electronic drive signals of the optical energy emitter (e.g., IR laser diode) and the optical return sensor (e.g., an IR sensing, gate-able CCD array of pixels) complicates the situation. Use of multi-polarity power supplies can disadvantageously drive system complexity, size and costs to unacceptable levels. In particular when a self-powered head-mounted display device is use, it is desirable to keep battery weight and size relatively small.

FIG. 1A presents an exemplary environment 100 in which a see-through head mounted display device (st-HMD) having a TOF sub-system embedded therein is used for enabling distance determination for real objects in a field of view seen by a user wearing the see-through HMD.

More specifically, FIG. 1A schematically depicts a multi-user environment 100 in which a first user 18 wears a respective first head mounted device (shown magnified at 150) and sees by way of partial see-through functionality of the HMD 150 an augmented reality surrounding that includes both real objects and virtual objects. The real objects may include a chair 16, a hub computing system 10 and a wide sized display 11 disposed relatively close to the first user 18. A real second user 19 is depicted as being positioned farther away from the first user 18. The virtual objects in the augmented reality surrounding may include a virtual monster 17 which is three-dimensionally positioned in front, behind and/or between various ones of the real objects and differently relative to the two users. For example, computer generated image data may cause the virtual monster 17 to appear as overlaid besides the real chair 16 when perceived through selective see-through lenses of the first HMD 150. The second user 19 may wear his own and respective second HMD and perceive things differently based on relative distances between himself and real and virtual objects within the augmented reality environment 100. In the illustrated example, a first distance between the worn first HMD 150 of the first user 18 and the second user 19 is denoted as D1. A second distance between the worn first HMD 150 and the real chair 16 is denoted as D2. A third distance between the worn first HMD 150 and the virtually superposed monster 17 is denoted as Dv while a fourth distance between the worn first HMD 150 and a real furniture stand on which real display 11 is mounted is denoted as D4.

A Time of Flight (TOF) sub-system 160 is mounted to an upper frame portion of the HMD 150 and used for determining in real-time the various real distances (e.g., D1, D2, D4) between the first user's head and surrounding real objects. The determined real distances may be used in combination with determined head orientation to electronically construct in real-time a three-dimensional (3D) mapping of real objects surrounding the user. The latter data is then used to electronically construct in real-time a stereoscopic image of the virtually superposed monster 17 as appropriately sized and positioned relative to the viewable other objects in the mixed reality environment 100. User experience and a sense of realism may be enhanced when the various real distances (e.g., D1, D2, D4) are accurately determined.

The illustrated hub computing system 10 may include a computing apparatus 12, one or more reality capturing devices 21 (e.g., which may have their own TOF sub-systems—not shown), and a display 11, all in wired and/or wireless communication with each other as well as with a computer network (not shown). The reality capturing devices 21 of the hub computing system 10 may operate in time multiplexed cooperation with the TOF sub-system 160 of the HMD 150. More specifically, the HMD TOF sub-system 160 may output a burst of scenery strobing first pulses during first time periods that are relatively short (e.g., 1/300th of a second per burst) followed by long stretches (e.g., 1/30th of a second per stretch) of no strobing. The reality capturing devices 21 of the hub computing system 10 may automatically determine when the non-strobing periods of the in-scene HMDs occur and may output their own strobing pulses during those times. The scenery strobing pulses of the respective devices 21 and 150 may be PWM coded and/or may occupy different portions of the electromagnetic spectrum.

The illustrated computing apparatus 12 may further be in wireless communication with an additional data processing device 5 (e.g., smartphone, touch tablet etc.) worn by the first user 18 where that worn data processing device 5 is in wired and/or wireless communication with the worn first HMD 150. In one embodiment, one or more of the users may further wear a so-called, smartwatch 29 which has its own data processing resources and is in wireless communication with one or more of the local user's additional data processing devices (e.g., with smartphone 5) and/or with the hub computing system 10. The worn data processing devices 5, 29 may contain respective low voltage portable power sources such as those comprising one or more rechargeable batteries (not shown, e.g., each having about 1.5 VDC output). In one embodiment, the HMD 150 may include a wireless or wired recharging means (not shown) by way of which its on-board battery (not shown) may be respectively recharged in a wireless or detachably wired recharging manner form one or more of ancillary devices, 5, 29 and 12.

Computing apparatus 12 may include one or more digital and/or analog signal processors as well as corresponding power supplies for powering those processors. Capture device 21 may include a combined color and depth sensing camera that may be used to visually monitor one or more targets including humans and one or more other objects within a particular environment 100. In one example, capture device 21 may comprise an RGB sensing array and an IR or near infrared (NIR) based depth sensing array and computing apparatus 12 may operate as a set-top box and/or as a real time gaming console. As indicated above, the capture device 21 may operate in time multiplexing and/or spectrum multiplexing cooperation with other in-room TOF determining sub-systems (e.g., 160). Additionally, the hub computing system 10 may be in cooperative wireless communication with multiple ones of head mounted displays (only one shown in detail as HMD 150) present in the local environment 100 and/or present in a remote environment (not shown).

As depicted in FIG. 1A, the first user 18 wears a respective first see-through head-mounted display denoted here as 150(1) and the second user 29 may wear his own see-through head-mounted display designated here as 150(2) although not explicitly referenced in the drawing. The worn see-through head-mounted displays, 150(1) and 150(2) may receive virtual data from any of a number of processing devices as described herein, including hub computing system 10, smartphone 5 and/or smartwatch 29 such that a three-dimensional (3D) virtual object (e.g., monster 17) is perceived by each HMD wearing user to exist within a respective field of view as displayed through the respective HMD. For example, as seen by user 18 through his see-through head-mounted display 150(1), the virtual object 17 is displayed as pointing its backside toward first user 18. As seen by second user 19 through his see-through head-mounted display 150(2), the virtual object 17 is displayed as facing toward that second user 19 and standing closer to the second user 19 than the real chair 16.

Referring to the magnified depiction 160" of the embedded TOF sub-system 160 of the first HMD, in one embodiment, the TOF sub-system 160 is formed on a C-shaped multilayer printed circuit board (PCB) 161 that sports a combination RGB and IR/NIR camera 165 at its center and a plurality of laser light emitters (e.g., IR and/or NIR laser diodes) such as 162a and 162b near the terminal ends of the legs of its C-shaped configuration. The positioning and/or angling of the respective laser light emitters (e.g., 162a, 162b) may provide for a wider pulse strobed illuminating (in the IR and/or NIR bands of the user's surrounding than might be possible or practical with just a single, center mounter laser light emitter (not shown). The laser light emitters 162a, 162b may each comprise one or more high power laser diodes connected in various series and/or parallel electrical connection configurations. An on board, voltage boosting circuit (not shown) generates a voltage greater than that of the on-board portable battery or batteries for powering the high power laser diodes. In one embodiment, a half length D0 of the illustrated C-shaped PCB 161 is about 2.1 inches and each extension leg thereof is about 1.0 inch long such that there is an electromagnetic signal propagation length of about 3 inches between the centrally disposed camera 165 and each of the terminally disposed laser light emitters 162a, 162b. The terminally disposed laser light emitters 162a, 162b can be, but do not necessarily need to be of a same kind. They alternatively could have different optical output wavelength spectrums and/or they can point out from the forward major face of the PCB 161 at different 3D directed angles. In one embodiment, the terminally disposed laser light emitters 162a, 162b are angled to provide a 120 degree wide strobed illumination of the user's filed of view. Although just two such laser light emitters 162a, 162b are shown in FIG. 1A, other embodiments may comprise one or a greater number of light emitters having respective optical output power capabilities, respective optical output spectrums and/or respective axes of optical output distribution and room-sweep capability (e.g., more than 120 degrees laterally and/or vertically). The optical output distributions need not be circular and instead could be multi-polar or otherwise configured.

Although not shown in FIG. 1A, metallic heat sinks may be provided at the backsides of the PCB 161 where the laser light emitters 162*a*, 162*b* (e.g., IR/NIR laser diodes) are disposed so as to provide for cooling of the light emitters 162*a*, 162*b* after each respectively outputs a respective burst of light pulses. The heat sinks may be operatively coupled to air vents that are thermally isolated from the user. In one embodiment, the light emitters 162*a*, 162*b* alternate between each outputting a 3.33 millisecond (ms) burst of about 10,000 pulses, with each pulse having a pulse width in the range of about 5 ns to 23 ns, where the 3.33 ms long train of output optical pulses is followed by a no-output period (no-strobing period) of about 30 ms to thereby complete a ⅓₀th of a second frame period. A different one of the laser light emitters on the HMD may provide its output train of optical pulses in the next frame and so on, such that each on-HMD laser light emitter has a longer time to cool off. Other TOF sub-systems (e.g., those of capture devices 21) may output their own scenery strobing pulses during the no-strobe periods of the HMD-mounted light emitters (e.g., 162*a*, 162*b*). The no-output period of about 30 ms per frame may be used for data processing purposes and/or to refresh the on-board voltage booster that powers the high power light emitters 162*a*, 162*b* with a voltage level greater than that of the on-board battery or batteries (e.g., greater than 1.5 VDC, greater than 3.0 VDC or greater than 4.5 VDC).

In one embodiment, the 3.33 ms long train of output optical pulses is subdivided into 0.022 ns long repeat intervals where the number of pulses in each repeat interval and the placements of the leading and trailing edges of those pulses in the repeat interval is controllable by means of software, for example to a precision of around 100 picoseconds or less (85 picoseconds in one embodiment). For example it may be desirable to produce within the repeat interval, a predetermined number of pulses each having a peak plateau width of about 6 ns, a leading edge rise time of about 3 ns or less and a trailing edge fall time of about 10 ns or less. The specific waveform of the repeat interval and the phasing of the pulses in that interval may be varied to improve signal-to-noise performance and to minimize interference from undesired higher order harmonics. See for example U.S. Pat. No. 8,587,771 (issued Nov. 19, 2013) which describes how choice of waveform may affect performance.

At substantially the same time as the software-defined pulse train is output from the then utilized light emitter (e.g., 162*a*), shutter control pulses are propagated to and applied to an IR/NIR sensor array of the camera 165 so as to operate an integrated, electronic shutter mechanism of the camera 165 (e.g., a CCD based charge dump mechanism). The shutter control pulses may drive a voltage bias terminal of the camera 165 and may thus control a light sensitivity and pulse discriminating attribute of the camera 165. More specifically, if the target real object (e.g., chair 16) is relatively close to the user and highly reflective, then the return trip light pulses will come back relatively strong and timed to be near the beginning of a sensing period that might additionally be filled with noise and artifacts. The shutter is operated at low sensitivity and as shut closed after the beginning of the sensing period so as to block out the noise and artifacts but to capturing the leading and/or trailing edges of selected ones of the returned pulses of photons. On the other hand, if the target real object (e.g., second user 19) is relatively far from the first user 18 and poorly reflective, the return trip light pulses will come back relatively weak and timed to be near the end of the return light sensing period. In that case, the camera shutter may be operated at high sensitivity and as shut closed at the beginning of the sensing period while open near the end. In other words, the shutter mechanism may be variably operated to compensate for the different return light possibilities, for example by being open for only a short period of time near the front end of the return light sensing period and by being open for a longer time near the tail end of the return light sensing period so as to avoid oversaturation from too bright of return light from nearby reflective objects and so as to avoid too low of a sensitivity for weak return light from far away and less reflective target objects.

The timings and magnitudes of the electronic shutter pulses as applied to the centrally mounted camera 165*a* and the timings of the electronic light emission drive pulses as applied to the terminally disposed light emitters 162*a*, 162*b* need to be synchronized to be very close chronologically to one another. In one embodiment, a reference clock generator (see also 163*b*" of FIG. 1B) is provided in a PCB circuit section 163*b* located about midway between the camera 165 and a first (e.g., 162*b*) of the light emitters. A first electromagnetic signal propagation time delay is experienced by electrical signals traveling from PCB circuit section 163*b* to a more terminal PCB circuit section 163*a* near the first (e.g., 162*b*) light emitter. A second electromagnetic signal propagation time delay is experienced by electrical signals traveling from PCB circuit section 163*b* to a more central PCB circuit section 163*c* near the camera 165. The first and second electromagnetic signal propagation time delays may vary as functions of temperature, fabrication process, voltage and/or other system parameters. One or more variable time delay elements are provided on the PCB 161 to compensate for these variation effects and to assure that the camera 165 receives its shutter control pulses (not shown in FIG. 1A, see instead 123*a*", 123*b*" of FIG. 1B) at substantially the same time as the light emitter (e.g., 162*b*) receives its waveform of laser drive pulses (not shown in FIG. 1A, see instead 121" of FIG. 1B). FIG. 1A additionally shows that other PCB circuit sections such as 164*a* may be interposed between the centrally mounted camera 165 and light emitters (e.g., 162*a*) disposed at the other terminal end of the printed circuit board (PCB) 161. As mentioned, there can be more than two laser light emitters and they may be disposed elsewhere on the PCB 161. A respective different time delay may be needed for each of the different disposed light emitters.

While not detailed in FIG. 1A, it is to be understood that the circuitry of PCB 161 may be in operative wired and/or wireless communication with other parts of the head-mounted display (HMD) 150 including for example with a regulated or unregulated low voltage power supply (e.g., 3.0 VDC, 4.5 VDC) disposed elsewhere in the HMD, a serial and/or parallel communication port disposed elsewhere in the HMD, processors and/or other control circuitry 136 disposed elsewhere in the HMD. Alternatively or additionally, electrical cable may be detachably operatively coupled to a worn further module such as smartphone 5 where the latter serves as a battery-powered low voltage power recharging supply for the HMD and as a communication mechanism for coupling to the computing hub 10 and/or directly to the internet or another form of network.

Figure 1B:
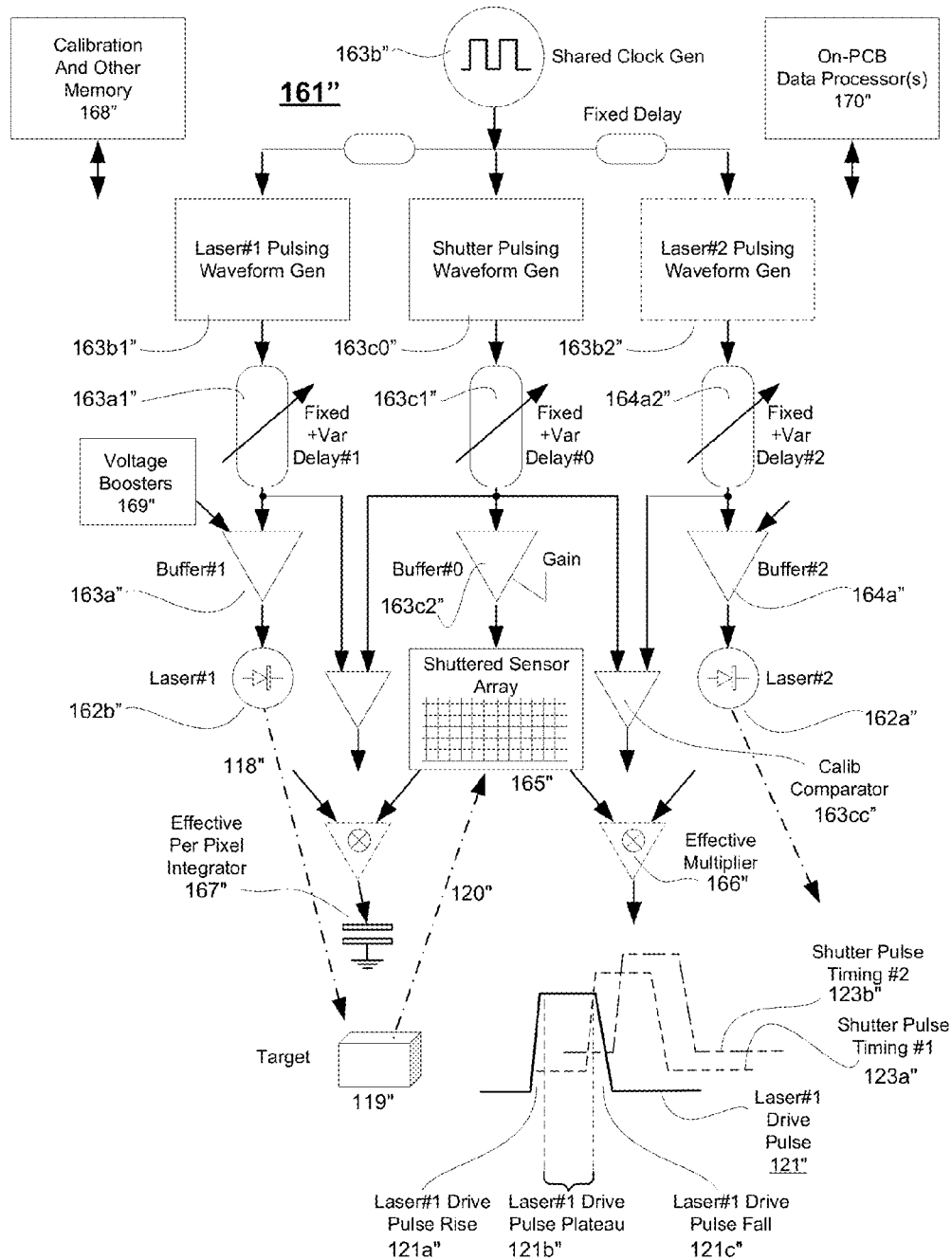
FIG. 1B is a schematic diagram organized to show a signal propagation race through physical space between signals used to drive the light emitters of FIG. 1A and signals used to gate light sensors of FIG. 1A.

Referring next to FIG. 1B, provided here is a schematic diagram organized to show how various electrical signals may propagate about the physical layout of a printed circuit board (PCB) 161" similar to that 161 of FIG. 1A. Not all of the elements shown in FIG. 1B are necessarily also provided on the PCB 161 of FIG. 1A. This will be made clearer as the details of FIG. 1B are described. The purpose of FIG. 1B is to show the correspondence between physical layout, component function, delays encountered by signals used to drive the light emitters (e.g., 162a", 162b"), delays encountered by the signals used to gate the light sensors (e.g., IR sensitive pixels) of the camera sensor array 165" mounted at its respective position on the PCB 161" and the variable delays that may be used to bring shutter and light emitter drive signals into very close temporal alignment with one another.

A reference clock generator 163b" is preferably disposed physically close to the camera array 165", for example in PCB area 163b of FIG. 1A. Immediately adjacent to the reference clock generator 163b", for example in PCB area 163c of FIG. 1A, there is provided a shutter pulsing waveform generator 163c0". In one embodiment, the shutter pulsing waveform generator 163c0" also serves as a laser pulsing waveform generator, thus obviating the need for blocks 163b1" and 163b2" where the latter are in that case replaced by short circuiting PCB traces. This explains part of what was meant above by not all of the elements shown in FIG. 1B being necessarily also provided on the PCB 161 of FIG. 1A. Alternatively, the shutter pulsing waveforms output by waveform generator 163c0" are custom tailored to how it is desired to drive a sensitivity shuttering aspect of the shuttered sensor array 165" (e.g., a CCD array) and in that case, one or both of the further illustrated, laser pulsing waveform generators, 163b1" and 163b2" are provided for separately defining the train of pulses that respectively drive laser light sources 162b" and 162a". In one embodiment, the laser number 1 (#1) pulsing waveform generator 163b1" is physically disposed in PCB area 163b of FIG. 1A and immediately adjacent to the shared reference clock generator 163b". In one embodiment, the Laser#1 pulsing waveform generator 163b1" is programmable, includes a tapped delay line with 85 picoseconds apart delay elements (or other small delay lengths) and allows for the generating of customized pulses including those having a rising edge duration of about 1 ns or less, a level plateau width of about 5 ns or more and a falling edge duration of about 1 ns or less. These may be used to drive a high voltage/high current light source driving buffer 163b". Due to parasitic capacitances present within the high voltage/current light source driving buffer 163b", the actual rise and fall times of electrical signals driven through the laser light source 162b" may be larger. More specifically, the falling edge duration of the electrical signals driven through the laser light source 162b" may be undesirably long, for example, longer than 10 ns. Reasons for this will be detailed below.

Propagation speeds of electrical signals through conductors and semiconductors tend to be substantially smaller than propagation speeds of photonic signals (e.g., 118" and 120") through air. This itself is not a problem. However, in order to properly generate the outgoing photonic signals (e.g., 118") and properly process the return photonic signals (e.g., 120") it is desirable that steep rising and falling edges be provided in the buffered output signals of buffer 163b" (e.g., in laser driving pulse 121") and in the buffered output signals of the shutter operating buffer 163c2" (e.g., in shutter driving pulses 123a" and 123b"). It is also desirable that the relative timing relations between these preferably steep rising and falling edges be controlled to a high level of resolution in spite of variations in system operating temperatures, variations in system fabrication processes and circuitry layout choices.

To this end, at least one digitally controllable time delay element is provided as interposed between either the Laser#1 pulsing waveform generator 163b1" and its corresponding high power Buffer#1 163b" or between the Shutter pulsing waveform generator 163c0" and its corresponding Buffer#0 163c2" or between the Laser#2 pulsing waveform generator 163b2" and its corresponding high power Buffer#2 164a". For sake of generality, all three of such interposed and digitally controllable time delay elements, 163a1", 163c1" and 164a2" are respectively shown in FIG. 1B. It is to be understood that in addition to having the optionally interposed, digitally controllable time delay elements, there will be some relatively fixed time delaying elements (e.g., PCB traces) in the respective signal propagating paths between the Laser#1 pulsing waveform generator 163b1" and its corresponding high power Buffer#1 163b"; between the Shutter pulsing waveform generator 163c0" and its corresponding Buffer#0 163c2"; and between the Laser#2 pulsing waveform generator 163b2" and its corresponding high power Buffer#2 164a". The fixed delays may vary as functions of temperature, variations in system fabrication processes and circuitry layout choices. One or more calibration processes adjust the at least one included of digitally controllable time delay elements, 163a1", 163c1" and 164a2" to compensate for those variations as well as for non-linearities in control functions. The specifics of such calibration processes are outside the scope of the present disclosure. In one embodiment, one or more calibration comparators (e.g., 163cc") are provided on the PCB 161" and each connected for receiving the leading and falling edges of the shutter driving pulses (as input into Buffer#0 163c2") and for receiving the leading and falling edges of at least one of the light emitter pulsing trains (as input into Buffer#1 163b" or into Buffer#2 164a") and for determining when; due to adjustment of the digitally controllable time delay element(s), (at least one of 163a1", 163c1" and 164a2") the received edges are time wise crossing relative to one another. Thereafter, a desired timing relationship between the shutter driving pulses (as input into Buffer#0 163c2") and the light emitter pulsing trains (as input into Buffer#1 163b" or into Buffer#2 164a") may be digitally commanded with use of on or off-board digital controllers and/or data processors 170" and on or off-board calibration parameter storing memories 168" and on or off-board control software stored in on or off-board instruction storing memories such as for example 168".

The one or more calibration comparators (e.g., 163cc") of the one embodiment do not, however, detect the timing relations of signals within or output by the shutter driving Buffer#0 163c2" and the light source, direct driving Buffer#1 163b" and Buffer#2 164a". This is so because the calibration comparators (e.g., 163cc") operate with low voltage, logic level signals whereas, at least the light source direct driving Buffer#1 163b" and Buffer#2 164a" operate with relatively higher voltages and/or currents. In light of this, if a design change is to be made to the light source direct driving Buffer#1 163b" and Buffer#2 164a", that design change should not introduce a significant time delay to signals propagating through the light source direct driving buffer (e.g., 163b" and 164a") and that design change should not introduce a significant uncertainty as to the timing relationship between rising and falling edges of pulsed signals propagating through the light source direct driving buffer (e.g., 163b" and 164a").

Such a design change is disclosed herein. However, before it is described in detail, the remainder of FIG. 1B is described for sake of completeness.

The combined effect of the pulsed laser light (e.g., 118") and of the pulsed shuttering of the light sensitive sensor array 165" can be made equivalent to that of effectively multiplying (166") the magnitudes of the overlapping concurrent portions of the respective waveforms of the outgoing and shuttered return light. More specifically, FIG. 1B shows a leading edge portion of a first shutter driving pulse 123a" time-wise overlapping a falling edge portion 121c" of a direct laser driving pulse 121" where the assumption is that the sensed return light 120" corresponds to the magnitude of the illustrated direct laser driving pulse 121". The magnitude of the first shutter driving pulse 123a" can be controlled by a digital Gain control terminal of the shutter driving Buffer#0 163c2" so as to accommodate different magnitudes of sensed return light 120". If the first shutter driving pulse 123a" is at zero or the direct laser driving pulse 121" is at zero, the result of the effective multiplying of the two is zero. On the other hand, when both are non-zero the multiplication result is integrated and stored in an effective and per-pixel storage means 167" (which can be the CCD wise interconnected light sensing pixels of the array 165"). Time of Flight (TOF) can be determined by sampling many times to improve the signal to noise ratio. The statistical contours of the trailing edges (corresponding to edges 121c") of the returned light pulses can be explored by time-wise shifting the leading edges of the shutter driving pulses, for example by modulating between the phases of the first illustrated shutter pulse 123a" and that of the second illustrated shutter pulse 123b". Conversely, the statistical contours of the leading edges (corresponding to edges 121a") of the returned light pulses can be explored by time-wise shifting trailing edges of the shutter pulses when those time-wise overlap with the leading edges of the returned light pulses. Resolution for Time of Flight (TOF) determination can be improved by causing the leading and falling edges of the direct laser driving pulses 121" and of the direct shutter pulsing signals 123" to be as steep as practical.

Additionally, for sake of completeness, block 169" of FIG. 1B comprises one or more voltage boosters that increases a supplied DC power voltage from say a battery input or first regulated power supply input of 3 VDC or 4.5 VDC or 5.0 VDC to about 7.5 VDC so as to increase the drive power applied to the driven light source (e.g., IR laser diodes 162a" and 162b"). In one embodiment, the 7.5 VDC booster can supply a relatively steady stream of current of a magnitude of about 0.5 ADC or greater. Item 119" is laser target whose distance from the TOF sub-system is to be determined. In one variation, the respective, digitally adjustable delays of delay elements 163a1", 163c1" and 164a2" are instead integrated into their preceding waveform generators 163b1", 163c0" and/or 163b2" for example by changing the timing along a tapped delay line (part of a DDL not shown, see instead 201 of FIG. 2B) where the leading edge of the first pulse in a repeated train of such pulses appears.

Referring to FIG. 2A, an example of a laser light source driver 201 is now described. A train of substantially rectangular pulses is generated by a multi-tapped digital delay line (DDL) 201 having a positive feedback element (e.g., amplifying buffer A0). The DDL 201 is digitally programmable (and controlled by an on-board memory and/or microcontroller, e.g., 168", 170" of FIG. 1B) such that chronological spacing between each of the pulses (only one shown at 221) in a repeat interval is customizable and such that chronological placement of a leading edge portion 221a of each such pulse 221 is customizable; chronological placement of a trailing edge (e.g., falling edge) portion 221c of each such pulse 221 is customizable and thus width of a peak plateau portion 221b of each such pulse 221 is customizable. In one embodiment, the leading edge portion 221a of the DLL generated pulse has a rise time of less than 1 ns and the trailing edge 221c has a fall time of about 1 ns or less. The width of the peak plateau portion 221b is controllable in increments as small as about 85 picoseconds. Thus precise fine tuning of edge placement is possible. It is within the contemplation of the present disclosure to use other programmable pulse train generators with similar capabilities for coarse and fine chronological placement of pulses and of their respective leading and trailing edges where the edges have such relatively steep rise and fall geometries. The magnifying glass in FIG. 2A points to node N2 and shows in magnification one of the 5.0V peak pulses appearing at node N2.

The illustrated laser light source driver 201 of FIG. 2A further comprises a plurality of bipolar junction transistors (BJT's), Qp3, Qn4 and a power MOSFET Qn7. BJT Qn4 is an NPN transistors while Qp3 is a PNP transistor. The power MOSFET Qn7 is an N-channel device. In one embodiment, all of Qp3, Qn4 and Qn7 are silicon based discrete devices having miniaturized solder bump mount packages with package dimensions on the order of about 1 mm. Thus they consume relatively little space on the PCB 160 (FIG. 1A). It is within the contemplation of the present disclosure to use other semiconductive material technologies for one or more of Qp3, Qn4 and Qn7 such as, but not limited to, III-V compounds such as GaAs and/or nitrides thereof or GaN, or strained lattice SiGe formulations and so forth.

Buffering amplifier A1 connects to a 5V power supply and level shifts the 3V pulses output by the DDL circuit 201 into 5V pulses. (In an alternate embodiment, the pulses are 4.5V high.) Complimentary bipolar junction transistors (BJT's), Qp3 and Qn4 form a dual polarity emitter-follower driver for the parasitic gate capacitance $C_p$ of the power MOSFET Qn7. The level shifted pulses 221 of the pulse train that are applied through node N2 to the base terminals of Qp3 and Qn4 has a peak plateau magnitude of about 5 volts. This value is picked to take advantage of the band gap characteristics of the silicon based BJT's, Qp3 and Qn4 of the exemplary embodiment 210. While the base drive voltage at node N2 is 0V before the leading edge of the pulse 221 arrives, Qp3 is forward biased (its base voltage is below that of its emitter) and it can exhibit a emitter to collector drop Vec3 of about 0.7V or lower. The base-to-emitter threshold drop for turning off PNP transistor Qp3 is about 0.6V. NPN transistor Qn4 is turned off because its base voltage is below that of its emitter. Thus the complimentary pair of transistors Qp3 and Qn4 keeps MOSFET Qn7 turned off until the leading edge portion 221a of the applied pulse 221 crosses above the 0.6V threshold at base node B3/N2. Therefore, good signal to noise immunity is provided for avoiding unintentional turning on of MOSFET Qn7 due to noise. In one embodiment, MOSFET Qn7 is sized to conduct drain to source currents ($i_{ds7}$) of magnitudes of 1A or greater (e.g., 10 A in some embodiments) and to withstand drain to source voltages of at least 7.5V or greater with negligible leakage when MOSFET Qn7 is turned off.

The collector of NPN transistor Qn4 is connected to a relatively high voltage rail (node V7) which in one embodiment, is generally maintained at about 7.5V by action of a voltage boosting circuit 207. Voltage boosting circuit 207 receives a power input from a 5 VDC source (or a 4.5 VDC source, neither shown). As soon as Qn4 becomes forward biased in response to the leading edge 221a of pulse 221, it supplies the V7 rail voltage (e.g., 7.5V minus the forward Vec drop of Qn4) to the emitter of PNP transistor Qp3 and causes the latter to become deeply reverse biased. The collector-to-emitter current $i_{gs1}$ of the turned-on NPN transistor Qn4 then rapidly charges the parasitic gate capacitance $C_p$ of the power MOSFET Qn7 to a voltage level just below the peak plateau level of the input pulse 221, where at that voltage level, Qn4 ceases to be forward biased but the driven power MOSFET Qn7 is turned on. In other words, this charging up of the MOSFET gate (G7) turns Qn4 off at substantially the same time (e.g., simultaneously) when its emitter voltage (node N3) rises above about 4.4V (which is 5.0V minus the 0.6V drop across the base-emitter junction). A large surge of current then flows through light emitting element (e.g., IR laser diode or series of laser diodes) interposed between the drain terminal D7 of the MOSFET and the V7 node as a result of the turning on of the MOSFET Qn7. In one embodiment, the surge has a magnitude of about 1.0 Amperes or higher. This surge has a relatively short duration because the width of the drive pulse 221 is on the order of about 50 ns or less (more specifically, about 6 ns in one embodiment).

When the trailing edge of pulse 221 appears, PNP transistor Qp3 turns back on after the base driving voltage (at node B3) drops below about 4.4V minus 0.6V. The forward emitter to collector drop across Qp3 inhibits rapid discharge of the gate capacitance Cp by way of discharge current $i_{gs2}$. Therefore the power MOSFET Qn7 is slow to turn off. In one embodiment, the trailing edge of the drain-source current $i_{ds7}$ of the power MOSFET extends over a duration of about 15 ns or more even though the trailing edge 221c of pulse 221 has a much shorter duration, for example on the order of about 1 ns to 5 ns.

In application areas such as Time of Flight (TOF) determining systems where steep edges are desirable, the slow discharge of the parasitic gate capacitance $C_p$ of the power MOSFET Qn7 is a problem.

FIG. 2B illustrates a self-synchronizing and low part count modification that overcomes or reduces the problem of slow discharge of the parasitic gate capacitance $C_p$ of the power MOSFET Qn7. The additional NPN transistor Qn1 in combination with discrete capacitor C1 and discrete resistor R2 provides a pulse width clamping function whose details are not germane to the present disclosure and for sake of simplicity, it may be assumed that Qn1 remains turned off (nonconductive as between its collector and emitter terminals).

Further as seen, an RL inductive component, RL55 is added between node N5 and ground. This addition will be described below in more detail.

A magnified exemplary embodiment of amplifier A1 is depicted in FIG. 2B. The exemplary amplifier A1 is composed of an even number of inverters such as the illustrated A1.1 and A1.2. The first inverter, A1.1 is a CMOS inverter powered by the on-board 3 volt power supply (V3). The second inverter, A1.2 is a CMOS inverter powered by the on-board 5 volt power supply (V5) and comprised of an NMOS transistor Qno in cascade connection with a PMOS transistor Qp0. The source of Qp0 connects to the V5 power rail. The drain of Qp0 connects to the drain of Qn0 and to node N2. The source of Qn0 connects to ground. The PMOS transistor Qp0 is sized such that when the output of first inverter A1.1 is low (e.g., at 0V) and Qn1 is below its trigger threshold, PMOS transistor Qp0 can output a forward biasing current $i_{LTTh0}$ for forward biasing the base-emitter junction of NPN transistor Qn4 with relatively small voltage drop (e.g., $V_{dsP0}$<0.5V) between the source (V5) and drain (N2) of Qp0. Additionally, the PMOS transistor Qp0 is sized relative to NPN transistor Qn1 such that if Qn1 is triggered into its high current mode, a relatively large voltage drop (e.g., $V_{dsP0}$>2.5V) appears between the source (V5) and drain (N2) of Qp0 when the output of first inverter A1.1 is low (e.g., at 0V), this occurring because the PMOS transistor Qp0 has insufficient current conducting capability (e.g., too small of a channel width) to output the relatively large first current, $i_{GTTh1}$ drawn by NPN transistor Qn1 when Qn1 is triggered into its high current mode. This set of conditions forces the NPN transistor Qn4 to shut off and stop applying approximately 5V to node N3. This in turn causes the power MOSFET Qn7 to turn off or at least switch into a reduced current mode because its gate-to-source voltage (at node G7) is below its saturated operation level. As a consequence, current flow $i_{ds7}$ through the high powered components (e.g., Qn7, Laser#1) decreases and overheating is prevented.

The added inductive component RL55 of node N5 has a characteristic inductance L5 and an inherent resistance R5. For example inductor RL55 may be of a wire-wound air core type configured for operating at frequencies of about 45 MHz and higher. Inductor RL55 is inserted so as to form an RLC loop when considered in combination with gate capacitance Cp of MOSFET Qn7. In one embodiment, the added inductor RL55 is in the form of a miniaturized solder bump mount package with package dimensions on the order of about 1 mm or less. Thus it consumes relatively little space on the PCB 161 (FIG. 1A) and does not substantially change signal propagation delay through the laser's direct drive buffer circuit 220. In the illustrated embodiment, one terminal of the dual terminal inductor RL55 connects directly to ground (e.g., a wide area ground plane among the plural conductive layers of the PCB 161) while the other terminal connects to node N5. The inductance L5 of the inductor RL55 is used to provide faster discharge of the high gate capacitance Cp of the power MOSFET Qn7. When Qn7 is being turned on, a first current $i_{La}$ flows downward through the inductance L5 and its characteristic resistance R5. When Qn7 is being turned off, a magnetic filed of L5 collapses and an induced second current $i_{Lb}$ flows downward through the inductor RL55 to more quickly discharge gate capacitance Cp.

The values of the added components, namely, resistor R2, capacitor C1 and inductive component RL55 may be heuristically determined using circuit simulation such as by way of a computer-implemented SPICE simulation. A sequence of events during turn-on and turn off are desired. Inductor L5 should have a sufficiently large inductance to oppose current flow therethrough at the start of the driving pulse 221 so that the output current of Qn4, after Qn4 switches on, first charges the parasitic gate capacitance $C_p$ of the power MOSFET Qn7 without having its current diverted down RL55 and thus it quickly turns MOSFET Qn7 on before a significant part of the output current of Qn4 is diverted into flowing through RL55. At the same time however, inductor L5 should not have so large of an inductance as to delay current flow therethrough after MOSFET Qn7 turns on because it is desirable to have a towards-ground first flow of current $i_{La}$ trickling through NPN transistor Qn4, resistance R5 and inductance L5 substantially immediately after MOSFET Qn7 turns on. This establishes a magnetic field for inductance L5 where the latter magnetic field should be available for assisting in a turn-off of MOSFET Qn7 where the turn-off can be initiated in as little as a few nanoseconds (e.g., 5 ns) after Qn7 is turned on.

Although gate node G7 may initially charge to about the same level as in the case of FIG. 2A (e.g., 5.0V minus 0.6V), in the case of modified circuit 220 where inductive circuit RL55 is present, it offers a current flow path from the gate node G7 to ground, and thus the voltage of node N5/G7 may drop below that initial charging level (e.g., 5.0V minus 0.6V) as bucking EMF in the inductor L5 dissipates and a magnetic field begins to grow together with the flow of a downward trickle current $i_{La}$ through the inductor L5. The drop in voltage at intermediate node N5 allows the NPN transistor Qn4 to repeatedly switch to, or remain at least slightly turned on (because its emitter voltage is below the 5.0V peak plateau voltage then present at its base (at node N2) and to thereby replenish the charge on capacitance Cp. Thus a magnetic field maintaining, trickle current $i_{La}$ continues to flow through Qn4 and into inductor L5 as long as the peak plateau voltage (e.g., 5.0V) of the input pulse 221 is maintained.

Next, when the trailing edge 221c of the input pulse 221 arrives and NPN transistor Qn4 turns off, the trickle-maintained magnetic field of inductance L5 begins to collapse. This induces a negative EMF in the inductance L5 which draws a discharge current $i_{Lb}$ out of parasitic gate capacitance $C_p$, through resistance R5, through inductance L5 and into the ground node. Due to this induced second current, $i_{Lb}$, the power MOSFET Qn7 is more quickly turned off than would have been possible if only the PNP transistor Qp3 were tasked with the job of discharging the gate capacitance $C_p$. In one simulated embodiment, the turn off time for the MOSFET dragged out to as much as about 14 ns when in the configuration of FIG. 2A but reduced to less than 10 ns (e.g., to about 5.5 ns) when in the configuration of FIG. 2B. In one simulated embodiment, the value of L5 was 27 nH (nano-Henries) while R5 was 2.3 ohms. In an alternate simulated embodiment, L5 was 33 nH while R5 was 4.0 ohms. The different configurations of inductive and resistance elements (L5, R5) of inductive circuit RL55 plus the different possible capacitance values Cp for the power MOSFET Qn7 plus other parasitic R, L and/or C components (not shown) in that loop can form various respective RLC circuits having corresponding voltage versus time and current versus time responses to rising edge and falling edge input signals appearing at node N3. Thus SPICE simulation and/or other empirical testing may be used to find practical values at least for L5 and R5 so as to achieve a balance of not depriving node G7 of too much turn on charge when it is desired to rapidly turn on MOSFET Qn7 and of quickly moving charge out of node G7 and to ground when it is desired to rapidly turn off MOSFET Qn7.

In one embodiment, a steady state output voltage produced by voltage booster 207 is digitally programmable. For example it may be raised to 10 VDC (as opposed to the above given example of 7.5 VDC) or it might be reduced to 6.5 VDC (as an example). To this end, a digitally programmable luminance control module 202' is shown in FIG. 2B as being operatively coupled to control the booster 207'.

Figure 2C:
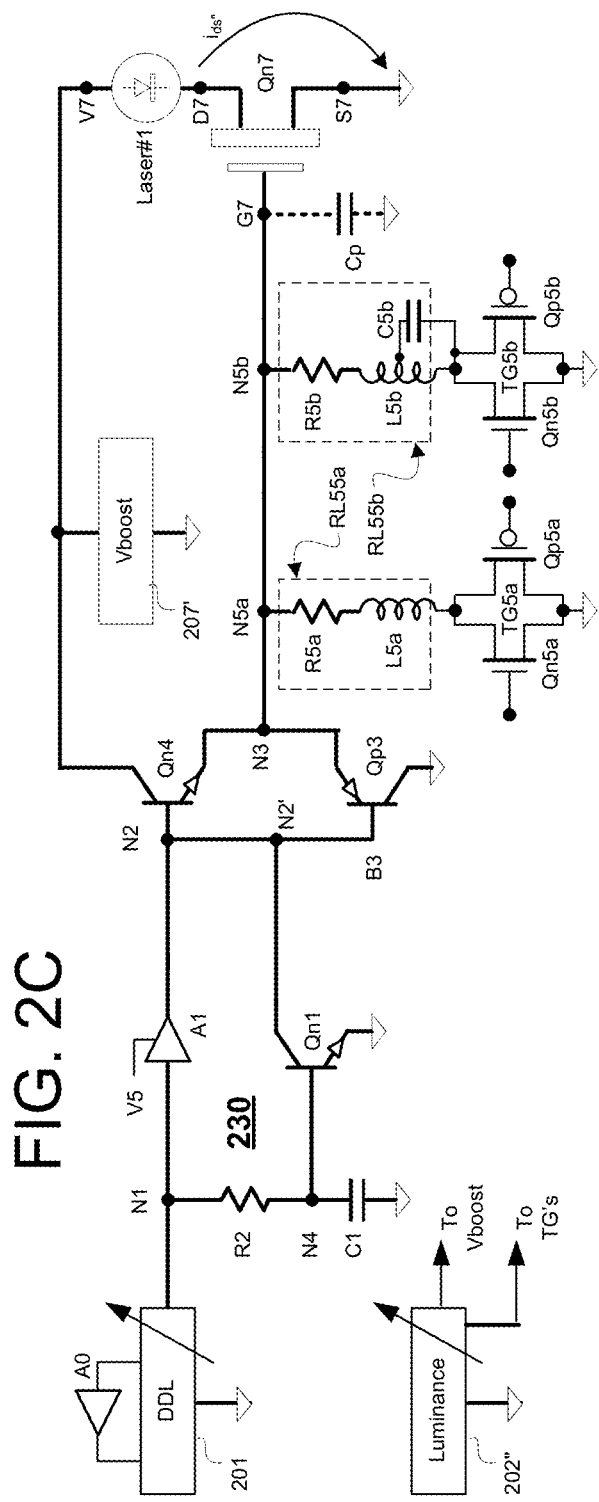
FIG. 2C is a schematic diagram of a third gate charging and discharging circuit.

FIG. 2C depicts an alternate embodiment, 230 in which a plurality of inductive circuits, such as RL55a and RL55b are provided at respective nodes N5a and N5b while being selectively coupled to ground by corresponding transmission gates TG5a and TG5b. Digitally programmable control module 202" may control the transmission gates, TG5a and TG5b so a to turn either one or both of them on to thereby achieve different results. Inductive circuits, RL55a and RL55b may be the same or different from one another. For example, in one embodiment, RL55b includes a capacitance C5b connected to a terminal end and intermediate tap point of L5b while RL55a does not have such a capacitance. The respective NMOS and PMOS transistors Qn5a/Qn5b and Qp5a/Qp5b of transmission gates TG5a and TG5b may be the same or different from one another. NMOS and PMOS transistors Qn5a/Qn5b and Qp5a/Qp5b need not be turned on and off at essentially the same time (e.g., simultaneously) but can, in one embodiment, be controlled in time staggered relation, for example in response to the drive pulses on node N2.

FIG. 3 is a flow chart showing the sequence of events 300 in more detail. At step 302, a pulse train is received by the direct laser driving buffer circuit (e.g., 220 of FIG. 2B) and in response to a leading edge of a received pulse (e.g., 221) exceeding turn-on threshold, a first part of the buffer (e.g., PNP transistor Qn4) begins charging a gate capacitance of a laser driving IGFET device (e.g. Qn7) while at the same time coupling the charging voltage (e.g., V7) to an inductor circuit (e.g., RL55).

In step 304, even though the charging voltage (e.g., V7) is coupled to it, the inductor (e.g., L5) resists an initial fast inrush of current into it due to inductive effect (due to induced back EMF). Thus the current initially supplied by the first part of the buffer (e.g., see $I_{gs1}$ of FIG. 2A) is directed to firstly charging the gate capacitance of the laser driving IGFET device (e.g. Qn7) and rapidly turning that device on.

In step 306, a magnetic flux field grows in the inductor circuit and current through the inductor (e.g., RL55) increases to level limited by other circuit impedances such as R5 and the collector-to-emitter resistance of Qn4.

In step 308, while the peak plateau part (e.g., 221b) of the applied pulse remains high, transistor Qn4 can remain slightly turned on and trickling a magnetic field maintenance current $i_{La}$ into the inductor even after the gate capacitance (e.g., Cp) of the laser driving IGFET device has been fully charged. The voltage at node N5 may drop below that at gate node G7 as Qn4 remains slightly turned on to supply the trickle current $i_{La}$ into the inductor. Next, when the trailing edge (e.g., 221c) of input pulse drops below a turn-off threshold, the trickle current providing part (e.g., Qn4) shuts off. However, due to inductive effects (e.g., collapsing magnetic field of L5) the inductor circuit tries to keep the previous current following through it going. As a result, a discharging current $i_{Lb}$ is induced for discharging the gate capacitance $C_p$ of the IGFET device (e.g. Qn7). Although a single two terminal inductive circuit (e.g., RL55) is shown in FIG. 2B, and such is advantageous for not consuming more space on the PCB 161, it is within the contemplation of the present disclosure to alternatively use more complex RLC circuits. For example, the two terminal inductive circuit RL55 might be replaced by a three terminal center-tapped inductor where the center tap connects to a capacitor having its other terminal gong to ground. This configuration might be used to increase the discharge current $i_{Lb}$ while not adversely increasing the MOSFET turn-on time.

In accordance with step 310, the collapsing magnetic field of the inductor-including circuit aids in discharging the gate capacitance of the IGFET device (e.g. Qn7) faster than could be done with the complementary Qp3 transistor alone. Accordingly, in step 312, the laser driving IGFET device is turned off more rapidly than if its gate capacitance (Cp) had been discharged by the complementary Qp3 transistor alone. Therefore, the produced laser pulse has a correspondingly steeper trailing edge.

In accordance with step 315, the steeper trailing edge of the produced laser pulse may be used for improved Time of Flight (TOF) determinations. It is to be understood that the present disclosure is not limited to faster turn off of merely laser-driving IGFET's. The concepts provided herein may be used in other applications where an IGFET has a relatively large gate capacitance (Cp) and yet needs to be turned on and/or off rapidly.

Although FIGS. 2B-2C and 3 are directed to a single combination of an IGFET driven laser emitter and a corresponding fast charge and discharge drive circuit for the one IGFET, it is to be understood that the PCB 161 of FIG. 1A (for example) can have two or more such combinations mounted thereon and thus the circuitry of FIGS. 2B-2C and the method of FIG. 3 can be many times repeated on and for the PCB without unduly adding many large components to the PCB and without causing significant temperature dependent variation of signal propagation delays due to the addition of the inductive circuitry (e.g., resistors R5, R5a, R5b and inductances L5, L5a, L5b of FIGS. 2B-2C) into the direct-to-laser driving buffer (e.g., 163a" of FIG. 1B). Accordingly, an elegant and small form factor solution is provided for reducing the discharge times of the plural IGFET laser emitter drivers (not all shown) without significantly increasing system weight, cost, size of complexity.

Figure 4:
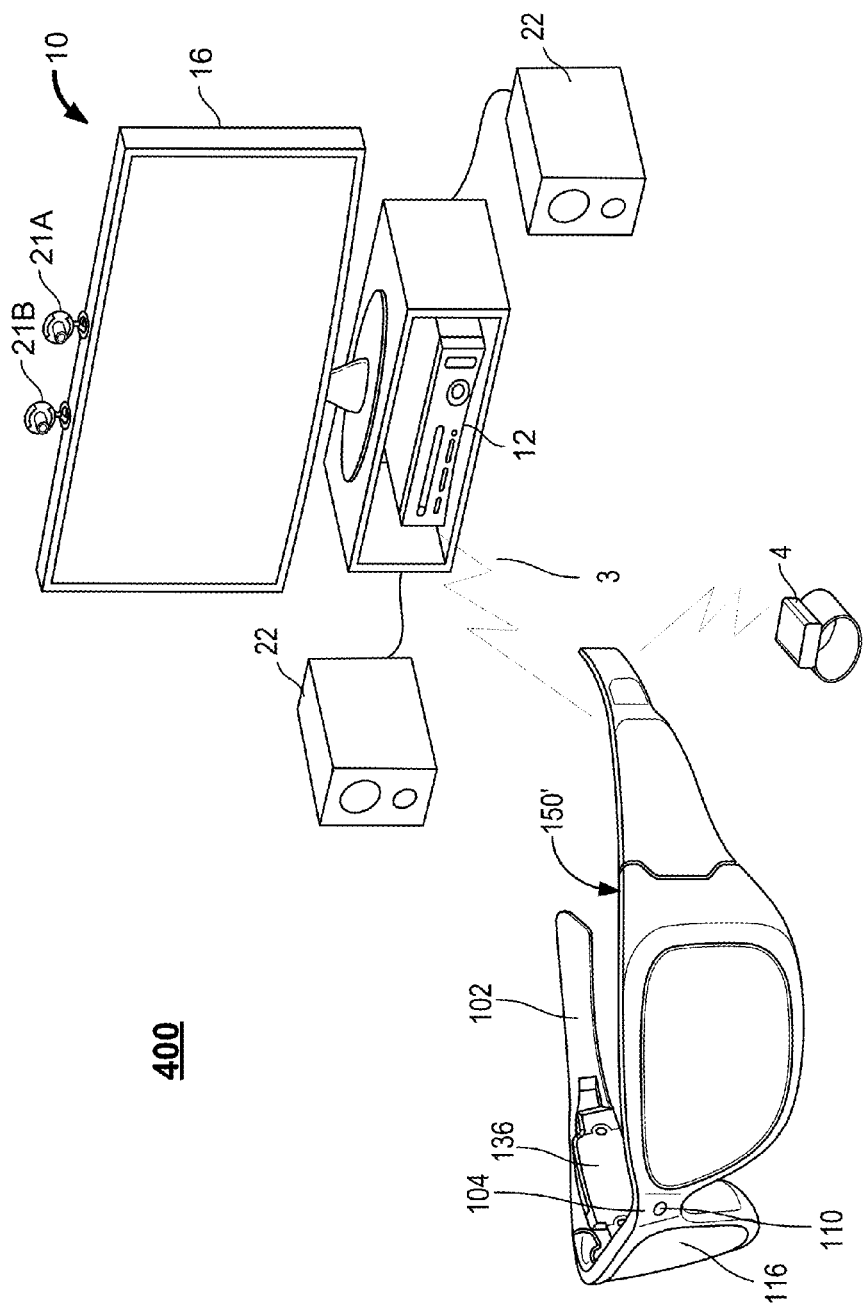
FIG. 4 is a block diagram depicting example components of an embodiment of a see-through, mixed reality display system with an on-board TOF sub-system.

FIG. 4 is a block diagram depicting example components of one embodiment 400 of a see-through, mixed reality display device using the rapid IGFET turn off aspect of the present disclosure. The illustrated system 400 includes a see-through display device as a near-eye, head mounted display device 150' in communication with a user-worn (e.g., belt-worn, or arm-worn) processing unit 4 via wireless link 3. Head mounted display device 150', which in one embodiment is in the shape of eyeglasses 116 in a frame 102, is worn on the head of a user so that the user can see through a display, embodied in this example as a separate display optical system for each eye, and thereby providing binocular vision including an actual direct view of the space in front of the user.

The use of the term "actual direct view" refers to the ability to see real world objects directly with the human eye through the lenses (e.g., 116) of the HMD 150', rather than seeing only created image representations of such objects. For example, looking through glass at a room allows a user to have an actual direct view of the room, while viewing a video of a room on a television is not an actual direct view of the room. Based on the context of executing software, for example, a gaming application, the system can project images of virtual objects (e.g., monster 17 of FIG. 1A), sometimes referred to as virtual images, on the display that are viewable by the person wearing the see-through display device while that person is also viewing real world objects through the display.

Frame 102 provides a support for holding elements of the system in place as well as a conduit for electrical connections. In this embodiment, frame 102 provides a convenient eyeglass frame as support for the elements of the system discussed further below. In other embodiments, other support structures can be used. An example of such a structure is a visor or goggles. The frame 102 includes a temple or side arm for resting on each of a user's ears. The visible temple side of 102 is representative of an embodiment of the right temple and includes control circuitry 136 for the display device 150'. Nose bridge 104 of the frame includes a microphone 110 for recording sounds and transmitting audio data to processing unit 4. Although not shown in FIG. 4, the C-shaped PCB 161 of FIG. 1A may be mounted just above the microphone 110 so as to allow for unimpeded receipt of audio signals while at the same time providing for accurate depth determination with use of TOF techniques.

In one embodiment, processing unit 4 is worn on the user's wrist and includes much of the computing power used to operate see-through head-mounted display 150'. Processing unit 4 may communicate wirelessly (e.g., WiFi, Bluetooth, infra-red, or other wireless communication means) to one or more hub computing systems 10.

Hub computing system 10 may include a computer, a gaming system or console, or the like. According to an example embodiment, the hub computing system 10 may include hardware components and/or software components such that hub computing system 10 may be used to execute applications such as real-time, multi-user gaming applications, non-gaming applications, or the like. In one embodiment, hub computing system 10 may include a processor such as a standardized processor, a specialized processor (e.g., one including high speed graphics support firmware), a microprocessor, or the like that may execute instructions stored on a processor readable storage device for performing the processes described herein.

Hub computing system 10 further includes one or more capture devices, such as capture devices 21A and 21B. In other embodiments, more or less than two capture devices can be used to capture the room or other physical environment of the user.

Capture devices 21A and 21B may, for example, include cameras that visually monitor one or more users in the local and surrounding space and capture poses, gestures and/or movements performed by the one or more users, as well as the structure of the surrounding space. The captured real world data may be analyzed, and tracked to perform one or more controls or actions within an application and/or animate an avatar or on-screen character. An application may be executing on hub computing system 10, the worn display device 150', and/or on a non-worn display 16 and/or on a mobile device 5 as discussed below or a combination of these.

Hub computing system 10 may be connected to an audiovisual device 16 such as a television, a monitor, a high-definition television (HDTV), or the like that may provide game or application visuals. For example, hub computing system 10 may include a video adapter such as a graphics card and/or an audio adapter such as a sound card that may provide audiovisual signals associated with the game application, non-game application, etc. The audiovisual device 16 may receive the audiovisual signals from hub computing system 10 and may then output the game or application visuals and/or audio associated with the audiovisual signals. According to one embodiment, the audiovisual device 16 may be connected to hub computing system 10 via, for example, an S-Video cable, a coaxial cable, an HDMI cable, a DVI cable, a VGA cable, component video cable, RCA cables, etc. In one example, audiovisual device 16 includes internal speakers. In other embodiments, audiovisual device 16, a separate stereo or hub computing system 10 is connected to external speakers 22.

Furthermore, as in the hub computing system 10, gaming and non-gaming applications may execute on a processor of the mobile device 4 which user actions control or which user actions animate an avatar as may be displayed on a display 7 of the mobile device 4. The mobile device 4 also provides a network interface for communicating with other computing devices like hub computing system 10 over the Internet or via another communication network via a wired or wireless communication medium. For example, the user may participate in an online gaming session with other mobile device users and those playing on more powerful systems like hub computing system 10. Examples of hardware and software components of a mobile device 4 such as may be embodied in a smartphone or tablet computing device. Some other examples of mobile devices 4 are a laptop or notebook computer and a netbook computer.

Figure 5A:
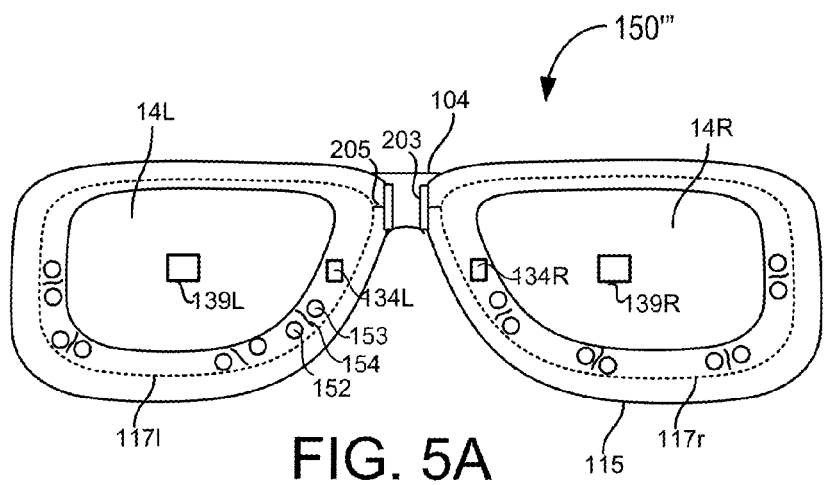
FIGS. 5A, 5B and 5C illustrate exemplary arrangements of various components about the frameworks of respective see-through head-mounted displays embodied as eyeglasses.

FIG. 5A illustrates an exemplary arrangement of a see through, see-through head-mounted display embodied as eyeglasses with movable display optical systems including gaze detection elements. What appears as a lens for each eye represents a display optical system 14 for each eye, e.g. 14R and 14L. A display optical system includes a see-through lens, e.g. 116 in FIG. 4A, as in an ordinary pair of glasses, but also contains optical elements (e.g. mirrors, filters) for seamlessly fusing virtual content with the actual direct real world view seen through the lenses 116. A display optical system 14 (of which portions 14R and 14L are a part of) has an optical axis which is generally in the center of the see-through lens 116, in which light is generally collimated to provide a distortionless view. For example, when an eye care professional fits an ordinary pair of eyeglasses to a user's face, a goal is that the glasses sit on the user's nose at a position where each pupil is aligned with the center or optical axis of the respective lens resulting in generally collimated light reaching the user's eye for a clear or distortionless view.

In the example of FIG. 5A, a detection area 139R, 139L of at least one sensor is aligned with the optical axis of its respective display optical system 14r, 14l so that the center of the detection area 139r, 139l is capturing light along the optical axis. If the display optical system 14 is aligned with the user's pupil, each detection area 139 of the respective sensor 134 is aligned with the user's pupil. Reflected light of the detection area 139 is transferred via one or more optical elements to an RGB image sensor of the eye-facing camera 134 (not the same as scenery facing camera 165 of FIG. 1A).

In one example, a visible light sensor array also commonly referred to as an RGB camera array may be the sensor, and an example of an optical element or light directing element is a visible light reflecting mirror which is partially transmissive and partially reflective. In some examples, a camera may be small, e.g. 2 millimeters (mm) by 2 mm. The camera 134 may further include an IR sensor array to which reflected IR radiation from spaced apart target objects may be directed. In some examples, the camera 134 may be a combination of an RGB and IR sensor arrays, and the light directing elements may include a visible light reflecting or diverting element and an IR radiation reflecting or diverting element.

In the example of FIG. 5A, there are four sets of gaze determining illuminators 153 (e.g., IR laser light emitters) paired with an eye-facing photodetector 152 for determining gaze direction and separated by a barrier 154 to avoid interference between the incident light generated by the illuminators 153 and the reflected light received at the photodetector 152. Additionally outward scene illuminating laser emitters (e.g., 162a, 162b, not shown in FIG. 5A) are provided on the other side of the eyeglass/giggles frame to provided TOF determination. For example the outward scene illuminating laser emitters (e.g., 162a, 162b) may be mounted on a PCB as indicated in FIG. 1A. To avoid unnecessary clutter in the drawings, drawing numerals are shown with respect to a representative pair. Each illuminator may be an infra-red (IR) illuminator which generates a narrow beam of light at predetermined one or more wavelengths for example in the infrared and/or near infrared (NIR) portion of the spectrum. Each of the photodetectors may be selected to capture light at the predetermined one or more wavelengths. Infra-red may also include near-infrared.

In FIG. 5A, each display optical system 14 has a respective arrangement of gaze detection elements facing each eye such as camera 134 (having left and right eye parts 134L and 134R) and its detection area 139, optical alignment elements (not shown), the illuminators 153 and photodetectors 152 are located on a movable inner frame portion 117l, 117r. In this example, a display adjustment mechanism comprises one or more motors 203 having a shaft 205 which attaches to an object for pushing and pulling the object in at least one of three dimensions. In this example, the object is the inner frame portion 117 which slides from left to right or vise versa within the frame 115 under the guidance and power of shafts 205 driven by motors 203. In other embodiments, one motor 203 may drive both inner frames. In one embodiment, a processor of control circuitry 136 of the display device 150 is able to connect to the one or more motors 203 via electrical connections within the frame 102 for controlling adjustments in different directions of the shafts 205 by the motors 203. Furthermore, the motors 203 access a power supply via the electrical connections of the frame 102 as well.

Figure 5B:
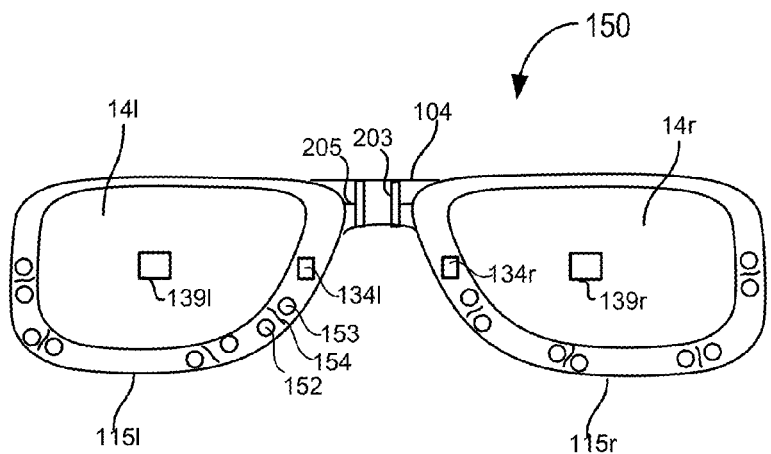

FIG. 5B illustrates another exemplary arrangement of a see through, see-through head-mounted display embodied as eyeglasses with movable display optical systems including gaze detection elements. In this embodiment, the each display optical system 14 is enclosed in a separate frame portion 115l, 115r, e.g. a separate eyeglass framed section, which is movable individually by the motors 203. In some embodiments, the movement range in any dimension is less than 10 millimeters. In some embodiments, the movement range is less than 6 millimeters depending on the range of frame sizes offered for a product. For the horizontal direction, moving each frame a few millimeters left or right will not impact significantly the width between the eyeglass temples, e.g. 102, which attach the display optical systems 14 to the user's head.

Figure 5C:
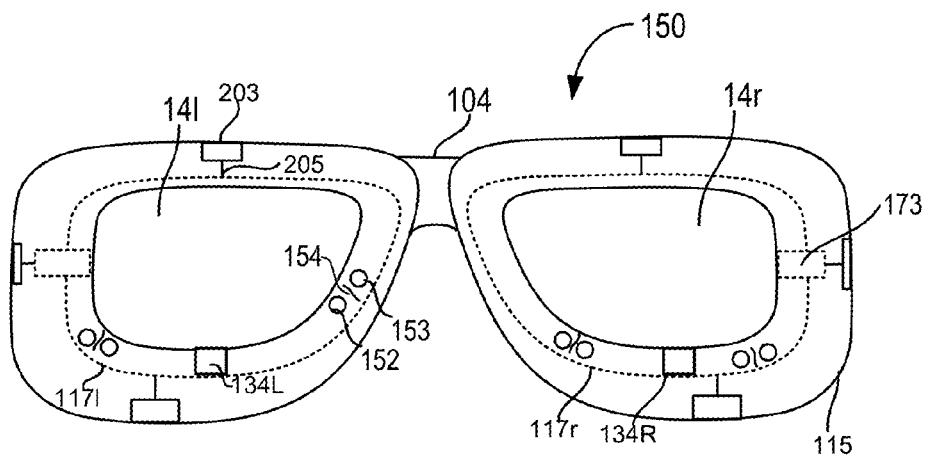

FIG. 5C illustrates another exemplary arrangement of a see through, see-through head-mounted display embodied as eyeglasses with movable display optical systems including gaze detection elements. In this example, the sensor 134r, 134l itself is in line or aligned with the optical axis at the center of its respective display optical system 14r, 14l but located on the frame 115 below the system 14. Additionally, in some embodiments, the camera 134 may be a depth camera or include a depth camera In this example, there are two sets of illuminators 153 and photodetectors 152.

FIG. 6 is a block diagram of one embodiment of hardware and software components of a see-through, near-eye display unit 150 as may be used with one or more embodiments. In this embodiment, see-through head-mounted display 150", receive instructions about a virtual image from processing unit 210 and provides the sensor information back to processing unit 210. Software and hardware components which may be embodied in a processing unit 210, will receive the sensory information from the display device 150" and may also receive sensory information from hub computing device 10. Based on that information (including depth information obtained from the TOF sub-system), processing unit 210 will determine where and when to provide a virtual image to the user and send instructions accordingly to the control circuitry 136 of the display device 150".

Note that some of the components of FIG. 6 (e.g., eye cameras 134, variable virtual focus adjuster 135, photodetector interface 139, micro display 120, illumination device 153 or illuminators, earphones 130, temperature sensor 138, display adjustment mechanism 203) are shown in shadow to indicate that there are two of each of those devices, one for the left side 14L and one for the right side 14R of head mounted display device 150". FIG. 6 shows the control circuit 200 in communication with the power management circuit 202. Control circuit 200 includes processor 210, memory controller 212 in communication with memory 214 (e.g., D-RAM), camera interface 216, camera buffer 218, display driver 220, display formatter 222, timing generator 226, display out interface 228, and display in interface 230. In one embodiment, all of components of control circuit 220 are in communication with each other via dedicated lines of one or more buses. In another embodiment, each of the components of control circuit 200 are in communication with processor 210.

Camera interface 216 provides an interface to the physical environment facing camera 165' and each eye camera 134 and stores respective images received from the cameras 165', 134 in camera buffer 218 (which includes a Z depth data storing portion and an RGB plane image storing portion for the case of the depth camera 165). Display driver 220 will drive microdisplay 120. Display formatter 222 may provide information, about the virtual image being displayed on microdisplay 120 to one or more processors of one or more computer systems, e.g. 20, 12, 210 performing processing for the augmented reality system. Timing generator 226 is used to provide timing data for the system. Display out 228 is a buffer for providing images from physical environment facing cameras 113 and the eye cameras 134 to the processing unit 4. Display in 230 is a buffer for receiving images such as a virtual image to be displayed on microdisplay 120. Display out 228 and display in 230 communicate with band interface 232 which is an interface to processing unit 4.

Power management circuit 202 includes voltage regulator 234, eye tracking illumination driver 236, variable adjuster driver 237, photodetector interface 239, audio DAC and amplifier 238, microphone preamplifier and audio ADC 240, temperature sensor interface 242, display adjustment mechanism driver(s) 245 and clock generator 244. Voltage regulator 234 receives power from processing unit 4 via band interface 232 and provides that power to the other components of head mounted display device 150. Illumination drivers 236 provide the IR lightsource drive signals for illumination devices 153, 162 as described above. Audio DAC and amplifier 238 receives the audio information from earphones 130. Microphone preamplifier and audio ADC 240 provides an interface for microphone 110. Temperature sensor interface 242 is an interface for temperature sensor 138. One or more display adjustment drivers 245 provide control signals to one or more motors or other devices making up each display adjustment mechanism 203 indicating which represent adjustment amounts of movement in at least one of three directions. Power management unit 202 also provides power and receives data back from three axis magnetometer 132A, three axis gyro 132B and three axis accelerometer 132C. In one embodiment, the power management circuit 202 includes a recharging management module (not shown) which allows the small on-board batteries (not shown, e.g. 3 VDC, 4.5 VDC) to be recharged in a detachably wired or wireless manner from an external source.

The variable adjuster driver 237 provides a control signal, for example a drive current or a drive voltage, to the adjuster 135 to move one or more elements of the microdisplay assembly 173 to achieve a displacement for a focal region calculated by software executing in the processing unit 4 or the hub computer 10 or both. In embodiments of sweeping through a range of displacements and, hence, a range of focal regions, the variable adjuster driver 237 receives timing signals from the timing generator 226, or alternatively, the clock generator 244 to operate at a programmed rate or frequency.

The photodetector interface 239 receives performs any analog to digital conversion needed for voltage or current readings from each photodetector, stores the readings in a processor readable format in memory via the memory controller 212, and monitors the operation parameters of the photodetectors 152 such as temperature and wavelength accuracy.

FIG. 7 is a block diagram of one embodiment of the hardware and software components of a processing unit 4 associated with a see-through, near-eye display unit. The mobile device 4 may include this embodiment of hardware and software components as well or similar components which perform similar functions. FIG. 7 shows controls circuit 304 in communication with power management circuit 306. Control circuit 304 includes a central processing unit (CPU) 320, graphics processing unit (GPU) 322, cache 324, RAM 326, memory control 328 in communication with memory 330 (e.g., D-RAM), flash memory controller 332 in communication with flash memory 334 (or other type of non-volatile storage), display out buffer 336 in communication with see-through, see-through head-mounted display 150 via band interface 302 and band interface 232, display in buffer 338 in communication with see-through head-mounted display 150 via band interface 302 and band interface 232, microphone interface 340 in communication with an external microphone connector 342 for connecting to a microphone, PCI express interface for connecting to a wireless communication device 346, and USB port(s) 348.

In one embodiment, wireless communication component 346 can include a Wi-Fi enabled communication device, Bluetooth communication device, infrared communication device, etc. The USB port can be used to dock the processing unit 4 to hub computing device 10 in order to load data or software onto processing unit 210 as well as charge processing unit 4. In one embodiment, CPU 320 and GPU 322 are the main workhorses for determining an XYZ mapping of the user's environment (including based of TOF determinations) and of where, when and how to insert images into the view of the user.

Power management circuit 306 includes clock generator 360, analog to digital converter 362, battery charger 364, voltage regulator 366, see-through, near-eye display power source 376, and temperature sensor interface 372 in communication with temperature sensor 374 (located on the wrist band of processing unit 4). An alternating current to direct current converter 362 is connected to a charging jack 370 for receiving an AC supply and creating a DC supply for the system. Voltage regulator 366 is in communication with battery 368 for supplying power to the system. Battery charger 364 is used to charge battery 368 (via voltage regulator 366) upon receiving power from charging jack 370. Device power interface 376 may provide recharging power to the smaller on-board batteries of the display device 150. The voltage regulator may provide one or more of specific voltages for powering the HMD 150 including for example a 3.0 VDC signal and a 4.5 VDC signal.

The figures above provide examples of geometries of elements for a display optical system which provide a basis for different methods of determining Z-depth as discussed above. The method embodiments may refer to elements of the systems and structures above for illustrative context; however, the method embodiments may operate in system or structural embodiments other than those described above.

The example computer systems illustrated in the figures include examples of computer readable storage media. Computer readable storage media are also processor readable storage media. Such media may include volatile and non-volatile, removable and non-removable media implemented in any method or technology for storage of information such as computer readable instructions, data structures, program modules or other data. Computer storage media includes, but is not limited to, RAM, ROM, EEPROM, cache, flash memory or other memory technology, CD-ROM, digital versatile disks (DVD) or other optical disk storage, memory sticks or cards, magnetic cassettes, magnetic tape, a media drive, a hard disk, magnetic disk storage or other magnetic storage devices, or any other medium which can be used to store the desired information and which can accessed by a computer.

What has been disclosed therefore is that when a power MOSFET is used for driving relatively large surges of pulsed power through a laser emitter of a Time of Flight (TOF) determining system, the power MOSFET may have a relatively large gate capacitance which is difficult to quickly discharge. A gate charging and discharging circuit is provided having a bipolar junction transistor (BJT) configured to apply a charging voltage to charge the gate of the MOSFET where the BJT is configured to also discontinue the application of the charging voltage. An inductive circuit having an inductor is also provided. The inductive circuit is coupled to the MOSFET gate and further coupled to receive the charging voltage such that application of the charging voltage to the inductive circuit is with a polarity that induces a first current to flow through the inductor in a direction corresponding to charge moving away from the gate and such that discontinuation of the application of the charging voltage to the inductive circuit induces a second current flowing through the inductor in the direction corresponding to charge moving away from the gate such that the second current discharges the gate of the MOSFET gate. Faster turn off of the MOSFET is thus made possible and is synchronized to the discontinuation of the charging voltage.

What has been disclosed includes the use of a power insulated gate field effect devices such as IGFETs and MOSFETs capable of conducting short duration pulses of 0.5 ampre or greater apiece being used for driving relatively large surges of pulsed power through a laser emitter of a Time of Flight (TOF) determining system. The power IGFET or MOSFET has a relatively large gate capacitance which is difficult to quickly discharge. A gate charging and discharging circuit is provided having a bipolar junction transistor (BJT) configured to apply a charging voltage to charge the gate of the MOSFET where the BJT is configured to also discontinue the application of the charging voltage. An inductive circuit having an inductor is also provided. The inductive circuit is coupled to the IGFET gate and further coupled to receive the charging voltage such that application of the charging voltage to the inductive circuit is in a direction that induces a first current to flow through the inductor in a direction corresponding to charge moving away from the gate and such that discontinuation of the application of the charging voltage to the inductive circuit induces a second current flowing through the inductor in the direction corresponding to charge moving away from the gate such that the second current discharges the gate of the IGFET gate. Faster turn off of the IGFET is thus made possible.

A method of charging and discharging a gate of an insulated field effect transistor (IGFET) has also been disclosed where the method comprises: (a) applying a charging voltage to charge the gate of the IGFET; (b) applying the charging voltage at substantially the same time (e.g., simultaneously) to an inductive circuit having an inductor, the inductive circuit being coupled to the gate, the applying of the charging voltage to the inductive circuit being with a polarity that induces a first current to flow through the inductor in a direction corresponding to charge moving away from the gate; and (c) discontinuing the applying of the charging voltage to the inductive circuit; wherein the discontinuing of the applying of the charging voltage to the inductive circuit induces a second current to flow through the inductor in the direction corresponding to charge moving away from the gate, the second current discharging the gate of the IGFET.

The disclosed method may be one wherein the applying of the charging voltage is in response to receipt of a leading edge of an input pulse. The disclosed method may be one wherein the discontinuing of the applying of the charging voltage to the inductive circuit is in response to receipt of a trailing edge of the input pulse. The disclosed method may further comprise: (d) maintaining a trickle current following through the inductor in the direction corresponding to charge moving away from the gate, the maintaining of the trickle current being between the time of the applying of the charging voltage to charge the gate of the IGFET and the time of the receipt of the trailing edge of the input pulse. The disclosed method may be one wherein the applying of the charging voltage to charge the gate of the IGFET and the maintaining of the trickle current are both performed with use of a first bipolar junction transistor (first BJT). The disclosed method may further comprise: (e) using a second BJT to additionally discharge the gate of the IGFET in response to the receipt of the trailing edge of the input pulse. The disclosed method may be one wherein the first BJT is an NPN transistor, the second BJT is a PNP transistor and an emitter terminal of the first BJT is connected to an emitter terminal of second BJT. The disclosed method may be one wherein the inductive circuit includes a plurality of resistors coupled to the inductor. The disclosed method may be one wherein the plurality of resistors define a Y-shaped network having a first terminal thereof coupled to the inductor, a second terminal thereof coupled to a gate of the IGFET and a third terminal thereof coupled to receive the charging voltage. The disclosed method may further comprise: (f) applying an output current of the IGFET to a laser light emitter. The disclosed method may further comprise: (g) using the laser light emitter in a Time of Flight (TOF) determining system.

A circuit for charging and discharging a gate of an insulated field effect transistor (IGFET) has been disclosed with the circuit comprising: (a) a first transistor configured to apply a charging voltage to charge a gate of the IGFET, the first transistor being configured to also discontinue the application of the charging voltage; and (b) an inductive circuit having an inductor, the inductive circuit being coupled to the gate of the IGFET, the inductive circuit being further coupled and configured to receive the charging voltage such that application of the charging voltage to the inductive circuit is with a polarity that induces a first current to flow through the inductor in a direction corresponding to charge moving away from the gate and such that discontinuation of the application of the charging voltage to the inductive circuit induces a second current flowing through the inductor in the direction corresponding to charge moving away from the gate such that the second current discharges the gate of the IGFET. The disclosed circuit may be one wherein the first transistor is further configured to receive an input pulse having a leading edge, trailing edge and a plateau level interposed between the leading and trailing edges, the configuration of the first transistor being such that the first transistor applies the charging voltage in response to receipt of the leading edge and discontinues application of the charging voltage in response to receipt of the trailing edge. The disclosed circuit may be one wherein the first transistor is further configured to supply a trickle current to inductive circuit while receiving the plateau level of the input pulse.

The disclosed circuit may be one wherein the inductive circuit includes a plurality of resistors coupled to the inductor of the inductive circuit. The disclosed circuit may be one wherein the plurality of resistors define a Y-shaped network having a first terminal thereof coupled to the inductor, a second terminal thereof coupled to the gate of the IGFET and a third terminal thereof coupled to receive the charging voltage from the first transistor. The disclosed circuit may be one further comprising a second transistor, wherein the first transistor is an NPN bipolar junction transistor, the second transistor is a PNP bipolar junction transistor (BJT) and the second BJT is configured to partially discharge the gate of the IGFET.

A combination of the IGFET and a charging and discharging circuit a laser light emitter has been disclosed wherein the IGFET is configured to apply an output current of the IGFET to the laser light emitter so as to produce pulses of laser light having falling edges of durations less than 10 nanoseconds. The disclosed combination may further comprise a Time of Flight (TOF) determining system operatively coupled to receive return light pulses reflected from targets of the produced pulses of laser light having falling edges of durations less than 10 nanoseconds. The disclosed combination may further comprise a head mounted display (HMD) to which are mounted the laser light emitter, the charging and discharging circuit and a sensor array that is responsive to the return light pulses reflected from the targets. The disclosed combination may be embodied as a plurality of discrete components of sizes on the order of 1 mm or less and mounted on printed circuit board (PCB) having a center and terminal ends with a multi-spectrum camera mounted at the center and light emitters of predetermined spectral outputs mounted near terminal ends of the PCB. A reference clock generator may be disposed near the center while direct drivers of the light emitters are disposed near terminal ends of the PCB. One or more digitally programmable time delay units may provide time alignment between as between when leading and trailing pulse edges are directly applied to the light emitters and when a shutter mechanism of the centrally mounted camera is shuttered open or shuttered closed.

The technology disclosed herein may include that which is described in the general context of computer-executable instructions, such as program modules, being executed by a computer. Generally, program modules include routines, programs, objects, components, data structures, etc. that perform particular tasks or implement particular abstract data types. The technology may also be practiced in distributed computing environments where tasks are performed by remote processing devices that are linked through a communications network. In a distributed computing environment, program modules may be located in both local and remote computer storage media including memory storage devices.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A circuit adapted for charging and discharging a capacitive load, the circuit comprising:
   a first transistor configured to apply a charging voltage to charge the capacitive load, the first transistor having a driving terminal connected directly to the capacitive load to apply said charging voltage, the first transistor further having a driven terminal coupled to a voltage source and a control terminal operable to selectively activate and deactivate the first transistor, where deactivation of the first transistor operates to discontinue the application of the charging voltage; and
   an inductive circuit having an inductance, the inductive circuit being coupled to the capacitive load, the inductive circuit being further coupled and configured to receive the charging voltage such that application of the charging voltage to the inductive circuit is with a polarity that induces a first current to flow through the inductance in a direction corresponding to charge moving away from the capacitive load and such that discontinuation of the application of the charging voltage to the inductive circuit induces a second current flowing through the inductance in the direction corresponding to charge moving away from the capacitive load such that the second current discharges the capacitive load.

2. The circuit of claim 1 wherein:
   the first transistor is further configured to receive an input pulse having a leading edge, trailing edge and a plateau level interposed between the leading and trailing edges; and
   the configuration of the first transistor being such that the first transistor applies the charging voltage in response to receipt of the leading edge and discontinues application of the charging voltage in response to receipt of the trailing edge.

3. The circuit of claim 2 wherein,
   the trailing edge has a fall time of 1 ns or less.

4. The circuit of claim 3 wherein,
   the plateau level has a variable duration.

5. The circuit of claim 4 wherein,
   the leading edge has a rise time of less than 1 ns.

6. The circuit of claim 3 wherein;
   the inductive circuit and the capacitive load are connected in parallel one to the other to thereby define an RLC loop; and
   each of the inductive circuit and the capacitive load has a respective end directly connected to a wide area ground plane such that the wide area ground plane does not substantially alter an RLC characteristic of the RLC loop.

7. The circuit of claim 2 wherein,
   the first transistor is further configured to supply a trickle current to the inductive circuit while receiving the plateau level of the input pulse.

8. The circuit of claim 2 further comprising a second transistor, wherein the first transistor is an NPN bipolar junction transistor, the second transistor is a PNP bipolar junction transistor (BJT) and the second BJT is configured to partially discharge the capacitive load.

9. The circuit of claim 1 wherein:
   the inductive circuit and the capacitive load are connected in parallel one to the other.

10. The circuit of claim 1 wherein,
    the inductive circuit constitutes a variable inductance circuit having one or more programmably selectable inductances, where the variable inductance circuit is coupled to the capacitive load, where the variable inductance circuit is further coupled and configured to receive the charging voltage such that application of the charging voltage to the variable inductance circuit is with a polarity that induces a first current to flow through at least a programmably selectable first inductance of the variable inductance circuit and in a direction corresponding to charge moving away from the first capacitance and such that discontinuation of the application of the charging voltage to the variable inductance circuit induces a second current flowing through at least the programmably selectable first inductance in the direction corresponding to charge moving away from the first capacitance such that the second current discharges the first capacitance.

11. The circuit of claim 10 wherein:
the variable inductance circuit includes one or more non-inductive elements operatively coupled to at least the programmably selectable first inductance; and
the one or more non-inductive elements in combination with at least the programmably selectable first inductance define a Y shaped network.

12. The circuit of claim 1 wherein:
the inductive circuit includes one or more non-inductive elements operatively coupled to the inductance of the inductive circuit; and
the one or more non-inductive elements in combination with the inductance define a Y shaped network.

13. The circuit of claim 1 and further comprising:
the voltage source is a variable voltage supply operatively coupled to the driven terminal of the first transistor.

14. The circuit of claim 1 wherein:
the capacitive load is a switching controlling part of a combination of a light emitter and a switching device that switches the light emitter on and off.

15. A circuit adapted for charging and discharging a gate of a gate controlled switching device, the circuit comprising:
a first transistor configured to apply a charging voltage to charge the gate, the first transistor having a driving terminal connected directly to the gate to apply said charging voltage, the first transistor further having a driven terminal coupled to a voltage source and a control terminal operable to selectively activate and deactivate the first transistor, where deactivation of the first transistor operates to discontinue the application of the charging voltage; and
an inductive circuit having an inductance, the inductive circuit being coupled to the gate, the inductive circuit being further coupled and configured to receive the charging voltage such that application of the charging voltage to the inductive circuit is with a polarity that induces a first current to flow through the inductance in a direction corresponding to charge moving away from the gate and such that discontinuation of the application of the charging voltage to the inductive circuit induces a second current flowing through the inductance in the direction corresponding to charge moving away from the gate such that the second current discharges the gate.

16. The circuit of claim 15 wherein:
the gate of the gate controlled switching device has a parasitic capacitance; and
the inductive circuit and the parasitic capacitance are connected in parallel one to the other.

17. The circuit of claim 15 wherein:
the inductive circuit constitutes a variable inductance circuit having one or more programmably selectable inductances, where the variable inductance circuit is coupled to the gate of the gate controlled switching device, where the variable inductance circuit is further coupled and configured to receive the charging voltage such that application of the charging voltage to the variable inductance circuit is with a polarity that induces a first current to flow through at least a programmably selectable first inductance of the variable inductance circuit and in a direction corresponding to charge moving away from the gate of the gate controlled switching device and such that discontinuation of the application of the charging voltage to the variable inductance circuit induces a second current flowing through at least the programmably selectable first inductance in the direction corresponding to charge moving away from the gate of the gate controlled switching device such that the second current discharges the gate of the gate controlled switching device.

18. A circuit adapted for charging and discharging a load having a first capacitance, the circuit comprising:
a first transistor configured to apply a charging voltage to the load to thereby charge the first capacitance, the first transistor having a driving terminal connected to the load to apply said charging voltage, the first transistor further having a driven terminal coupled to a voltage source and a control terminal operable to selectively activate and deactivate the first transistor, where deactivation of the first transistor operates to discontinue the application of the charging voltage; and
a variable inductance circuit having one or more programmably selectable inductances, the variable inductance circuit being coupled to the load, the variable inductance circuit being further coupled and configured to receive the charging voltage such that application of the charging voltage to the variable inductance circuit is with a polarity that induces a first current to flow through at least a programmably selectable first inductance of the variable inductance circuit and in a direction corresponding to charge moving away from the first capacitance and such that discontinuation of the application of the charging voltage to the variable inductance circuit induces a second current flowing through at least the programmably selectable first inductance in the direction corresponding to charge moving away from the first capacitance such that the second current discharges the first capacitance.

19. The circuit of claim 18 wherein:
the variable inductance circuit and the load are connected in parallel one to the other.

20. The circuit of claim 18 wherein:
the variable inductance circuit includes a second capacitance.

* * * * *